(12) United States Patent
Tateyama et al.

(10) Patent No.: US 6,507,770 B2
(45) Date of Patent: Jan. 14, 2003

(54) SUBSTRATE PROCESSING SYSTEM AND SUBSTRATE PROCESSING METHOD

(75) Inventors: Masanori Tateyama, Kumamoto-Ken (JP); Kenichi Okubo, Kumamoto-Ken (JP); Jun Ookura, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 35 days.

(21) Appl. No.: 09/874,272

(22) Filed: Jun. 6, 2001

(65) Prior Publication Data

US 2001/0051837 A1 Dec. 13, 2001

(30) Foreign Application Priority Data

Jun. 7, 2000 (JP) .......................... 2000-170583

(51) Int. Cl.[7] ................................................. G06F 7/00
(52) U.S. Cl. ....................................................... 700/228
(58) Field of Search ................................. 700/228, 229, 700/230

(56) References Cited

U.S. PATENT DOCUMENTS

| | | | | |
|---|---|---|---|---|
| 4,809,196 A | * | 2/1989 | Miller | ................... 436/136 |
| 5,120,580 A | * | 6/1992 | Lesher et al. | ............ 427/376.2 |
| 5,550,956 A | * | 8/1996 | Tadokoro | ...................... 347/19 |
| 5,725,664 A | * | 3/1998 | Nanbu et al. | ................ 118/319 |
| 5,850,583 A | * | 12/1998 | Song et al. | .................... 399/24 |
| 5,888,381 A | * | 3/1999 | Primdahl et al. | ...... 200/81.9 M |
| 6,054,181 A | * | 4/2000 | Nanbu et al. | ................ 427/240 |
| 6,151,532 A | * | 11/2000 | Barone et al. | ......... 204/192.13 |
| RE37,470 E | * | 12/2001 | Ohkura et al. | .............. 118/500 |
| 6,394,670 B2 | * | 5/2002 | Ogata et al. | ........... 200/81.9 M |

* cited by examiner

Primary Examiner—Douglas Hess
Assistant Examiner—Richard Ridley
(74) Attorney, Agent, or Firm—Rader, Fishman & Grauer PLLC

(57) ABSTRACT

A system for successively extracting unprocessed substrates from a cassette, successively conveying the extracted substrates to a plurality of processing units, causing the processing units to process the substrates, and successively returning processed substrates to a cassette is disclosed. In the system, corresponding to a recipe that contains process conditions for each of at least one lot, a process start prediction time at which processes of each lot start and a process completion prediction time at which processes for each lot are completed are calculated for at least two processes. Corresponding to the process start prediction time and the process completion prediction time, at least one of optimum processing units that optimize processes for each lot is selected for each lot.

16 Claims, 18 Drawing Sheets

FIG. 11A

| | |
|---|---|
| BAKE | ～101 |
| BAKE | ～102 |
| BAKE | ～103 |
| BAKE | ～104 |
| BAKE | ～105 |
| BAKE | ～106 |
| BAKE | ～107 |
| BAKE | ～108 |

FIG. 11B

| | | |
|---|---|---|
| POBAKE | 180°C, 40sec | ～101 |
| POBAKE | 180°C, 40sec | ～102 |
| PEBAKE | 150°C, 30sec | ～103 |
| PREBAKE | 120°C, 30sec | ～104 |
| BAKE | NOT USED | ～105 |
| BAKE | NOT USED | ～106 |
| BAKE | NOT USED | ～107 |
| BAKE | NOT USED | ～108 |

FIG. 11C

| | | |
|---|---|---|
| POBAKE | 180°C, 40sec | ～101 |
| BAKE | NOT USED | ～102 |
| PEBAKE | 180°C, 60sec | ～103 |
| PEBAKE | 180°C, 60sec | ～104 |
| PREBAKE | 150°C, 10sec | ～105 |
| BAKE | NOT USED | ～106 |
| BAKE | NOT USED | ～107 |
| BAKE | NOT USED | ～108 |

FIG. 11D

| | | |
|---|---|---|
| POBAKE | 180°C, 30sec | ～101 |
| PREBAKE | 140°C, 20sec | ～102 |
| BAKE | NOT USED | ～103 |
| PEBAKE | 140°C, 40sec | ～104 |
| BAKE | NOT USED | ～105 |
| PEBAKE | 140°C, 40sec | ～106 |
| BAKE | NOT USED | ～107 |
| BAKE | NOT USED | ～108 |

| LOT | PREBAKE | | | PEBAKE | | | POBAKE | | |
|---|---|---|---|---|---|---|---|---|---|
| | NUMBER OF UNIT | TEMPERATURE | TIME PERIOD | NUMBER OF UNIT | TEMPERATURE | TIME PERIOD | NUMBER OF UNIT | TEMPERATURE | TIME PERIOD |
| 1 | 1 | 120 | 30 | 1 | 150 | 30 | 2 | 180 | 40 |
| 2 | 1 | 150 | 10 | 2 | 180 | 60 | 1 | 180 | 40 |
| 3 | 1 | 140 | 20 | 2 | 140 | 40 | 1 | 180 | 30 |
| 4 | 1 | 150 | 20 | 1 | 180 | 30 | 2 | 180 | 40 |

FIG. 12

| STEP | PROCESSING UNIT |
| --- | --- |
| S1 | ALIM |
| S2 | AD |
| S3 | COL |
| S4 | COT |
| S5 | PREBAKE |
| S6 | COL |
| S7 | EXP |
| S8 | PEBAKE |
| S9 | COL |
| S10 | DEV |
| S11 | POBAKE |
| S12 | COL |

FIG. 15

SUBSTRATE PROCESSING SYSTEM AND SUBSTRATE PROCESSING METHOD

BACKGROUND OF THE INVENTION

1. Field of the Invention

The present invention relates to a substrate processing system and a substrate processing method for performing a sequence of processes for various types of substrates such as semiconductor wafers and liquid crystal display (LCD) glass substrates.

2. Description of the Related Art

In fabrication processes for semiconductor devices and LCD glass substrates (LCD substrates), fine circuit patterns are formed using a photolithography technology. In the photolithography technology, a resist is coated in a film shape on the front surface of a raw substrate such as an LCD substrate or a semiconductor wafer and then exposed with a predetermined pattern. After the exposed pattern is developed and etched., a desired circuit pattern is obtained.

Recently, as the sizes of semiconductor wafers are becoming large, in the photolithography process, wafers are successively processed. For example, in a complex processing system that performs both of a resist coating process and a developing process, wafers are extracted from a cassette one by one. The extracted wafers are processed in a processing unit one by one. The processed wafers are returned to a cassette. For example, 25 semiconductor wafers are treated as one lot. A recipe (namely, a process program) is set to each lot. The heating process conditions such as pre-bake temperature and post-bake temperature depend on the recipe that is used. Thus, wafers W of the same lot are heat-processed in the same conditions.

In such a complex processing system, one unit is required for each process. However, when only one unit performs a designated process, the process time depends on the unit that is used. In other words, one unit requires a long process time, whereas another unit does not require a long process time. Such time differences cause the throughput of the system to lower. To solve such a problem, for a process that requires a long process time, a plurality of units are used for the same process (for example, two developing units are used) so as to prevent one process from being adversely affected by another process and thereby improving the throughput of the system. Such a method is referred to as multi-units for single-process method. In addition, for example, the cooling process and the heating process should be performed a plurality of times. However, such processes can be performed by the same units with different process conditions. Thus, it is not necessary to assign each process to each unit. Consequently, when all heating processes and cooling processes are shared in each flow, they can be effectively used.

In addition, when one process is performed by a plurality of processing units, before real processes are started, the processing units should be assigned.

However, in the case of for example a heat processing unit, if the unit is used as a pre-baking unit in the processes for the first lot and then used as a pre-baking unit in the processes for the second lot, assuming that the last temperature of the baking process for the first lot is 120° C. and that the first temperature of the baking process for the second lot is 180° C., it takes a long time to raise the temperature with the heater of the heat processing unit. Thus, when processing units are assigned, since it takes a long time until they accomplish desired temperatures, the throughput of the system becomes low.

To prevent the throughput of the system from lowering, the baking unit used for the first lot is not assigned. Instead, an unused baking unit is selected. Thus, when an unused baking unit is pre-heated, since it is not necessary to stop the processes until the heater accomplishes a predetermined temperature, the processes can be successively performed. However, it takes a long time until an unused baking unit at the room temperature accomplishes a predetermined temperature. In addition, the power supplied to the heater increases. Thus, the power consumption increases. In addition, when an unit for the second lot is selected, there m ay be no unused baking unit for the first lot.

SUMMARY OF THE INVENTION

An object of the present invention is to provide a substrate processing system and a substrate processing method that are capable of selecting optimum processing units.

A first aspect of the present invention is a substrate processing system, comprising a processing portion having a plurality of processing units for performing a plurality of processes for a first substrate and a second substrate, a conveying portion, disposed in the processing portion, for exchanging the first substrate with the second substrate at least between the processing units, a process procedure setting portion for set ting a process procedure that includes process conditions corresponding to the first substrate and the second substrate, and a selecting portion for obtaining a process start prediction time at which the process of each of the processing unit is started for the first substrate and the second substrate and a process completion prediction time at which the process of each of the processing units is completed for the first substrate and the second substrate corresponding to the process procedure and for selecting at least one of optimum processing units that optimize the processes for each of the first substrate and the second substrate in each of said first substrate and said second substrate corresponding to the process start prediction time and the process completion prediction time, the process start prediction time and the process completion prediction time being obtained for at least two processes.

A second aspect of the present invention is a substrate processing system, comprising a loading/unloading portion for loading a cassette that contains a plurality of unprocessed substrates for one lot and for unloading a cassette that contains a plurality of processed substrates for one lot, a processing portion having a plurality of processing units for performing a plurality of processes for a substrate, a conveying portion, disposed in the processing portion, exchanging substrates with the loading/unloading portion and successively conveying the substrates to the processing units, a process procedure setting portion for setting a process procedure that includes at least process conditions for at least each of lots, and a calculation processing portion for calculating a process start prediction time at which the process of each processing unit is started for each of lots and a process completion prediction time at which the process of each processing unit is completed for each of lots and for selecting at least one of optimum processing units that optimize processes for each of lots corresponding to the process start prediction time and the process completion prediction time, the process start prediction time and the process completion prediction time being obtained for at least two processes.

In the example, the process procedure contains at least information that designates a processing unit. More preferably, the process procedure contains a process recipe such as real process times of individual processing units and process conditions thereof.

Thus, corresponding to a process procedure, a process start prediction time at which the process of each processing unit is started and a process completion prediction time at which the process of each processing unit is completed are calculated for each lot. Corresponding to the process start time and the process completion time, an optimum processing unit that optimizes the process for each lot is selected. Thus, after the process of each processing unit is completed, another process can be smoothly started with other conditions.

Preferably, there is no unused processing units for each lot. An optimum processing unit is selected from the unused processing units. Thus, from all processing units used for a particular lot, an optimum processing unit that satisfies process conditions can be selected even if any processing unit cannot accomplish a recipe for the next lot.

The calculation processing portion preferably selects optimum processing units that accomplish the process procedure in shorter time periods after the process completion prediction time for one lot until the process start prediction time for the next lot. Thus, the control amount of a processing unit until it accomplishes a process procedure (for example, the amount of power supplied to the heater of the heat processing unit) can be decreased. Consequently, the power consumption can be decreased. In addition, the process cycle time period in the regular state of the system can be shortened.

The processing units preferably include at least two heat processing units. The process procedure preferably contains a set temperature for each of the heat processing units for each lot. The calculation processing portion more preferably selects an optimum processing unit from a plurality of heat processing units corresponding to the set temperature. Thus, units that accomplish a set temperature in shorter time periods can be successively selected. Consequently, the amount of power supplied to the heating mechanism of each heat processing unit can be decreased.

The calculation processing portion preferably has a storing portion for storing a heating characteristic curve and a cooling characteristic curve for the heat processing units. The calculation processing portion preferably selects an optimum processing unit corresponding to the heating characteristic curve and the cooling characteristic curve stored in the storing portion.

The calculation processing portion has a storing portion. The calculation processing portion preferably calculates the process start prediction time and the process completion prediction time corresponding to past process procedures and completion times stored in the storing portion.

The calculation processing portion preferably calculates a start time at which each of the heat processing units starts controlling a temperature corresponding to the process completion prediction time, the process start prediction time, the heating characteristic curve, and the cooling characteristic curve. Thus, in the shortest temperature control time period, lots can be successively processed. For example, a heater is disposed in an unit. The time at which the power is supplied to the heater is calculated. Thus, the timing at which the power is supplied to the heater is obtained. Consequently, the amount of power supplied to the heater can be minimized.

The calculation processing portion calculates the process start prediction time and the process completion prediction time corresponding to a process completion prediction time for predicting a timing for processes for one lot and to a process cycle time period of each of the processing units. Thus, the process start prediction time and the process completion prediction time can be easily calculated. The process completion prediction time may be one of a first process completion prediction time after the first substrate of one lot is conveyed to a processing unit until the first substrate is returned to the loading/unloading portion, a second process completion prediction time after the first substrate of one lot is conveyed to a processing unit until all substrates of the same lot are conveyed to the processing unit, or a third process completion prediction time after the first substrate of one lot is conveyed to a processing unit until all substrates of the same lot are retuned from the processing unit to the loading/unloading portion.

The calculation processing portion preferably has a storing portion for storing an elapsed time after the cassette changeable time period until a cassette change completion time. Thus, even if the operator forgot to change a cassette and thereby the successive lot processes stopped, the temperature control start time at which the heat processing unit starts the temperature control can be compensated. Thus, in such a case, the temperature can be accurately controlled. The cassette changeable time period is a time period for which a cassette can be changed for the next lot. After the cassette changeable time period elapsed, if a cassette is changed, the successive lot processes are stopped.

A third aspect of the present invention is a substrate processing method for successively extracting unprocessed substrates, successively conveying the extracted substrates to a plurality of processing units, causing the processing units to process the conveyed substrates, and successively returning the processed substrates to a cassette, the method comprising the steps of calculating a process start prediction time at which the processes for each lot are started and a process completion prediction time at which the processes for each lot are completed for each lot corresponding to a process procedure that contains process conditions for each of at least one lot, the process start prediction time and the process completion prediction time being calculated for at least two processes, and selecting at least one of optimum processing units for each lot for optimizing processes in said individual lot corresponding to the process start prediction time and the process completion prediction time.

These and other objects, features and advantages of the present invention will become more apparent in light of the following detailed description of a best mode embodiment thereof, as illustrated in the accompanying drawings.

BRIEF DESCRIPTION OF DRAWINGS

FIGS. 11A, 11B, 11C, and 11D are schematic diagrams showing examples of selected heat processing units for explaining the selecting operation according to the first embodiment of the present invention;

FIG. 12 is a schematic diagram showing process conditions necessary for the selecting operation of the heat processing units according to the first embodiment of the present invention;

FIG. 15 is a schematic diagram showing an example of a recipe according to the first embodiment of the present invention;

DESCRIPTION OF PREFERRED EMBODIMENTS

Next, with reference to the accompanying drawings, embodiments of the present invention will be described.

(First Embodiment)

Figure 1:
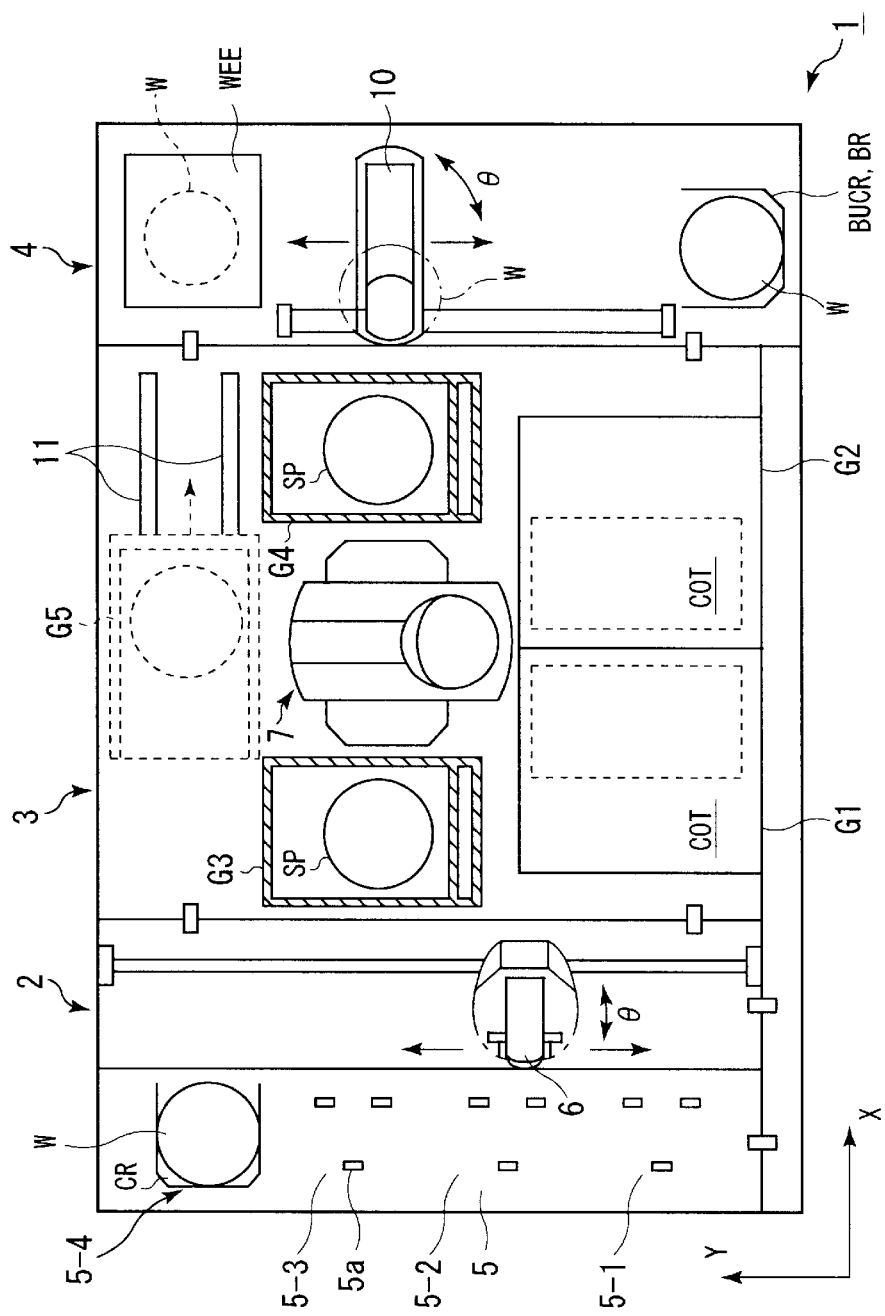
FIG. 1 is a plan view showing the overall structure of a substrate processing system according to a first embodiment of the present invention.
Figure 2:
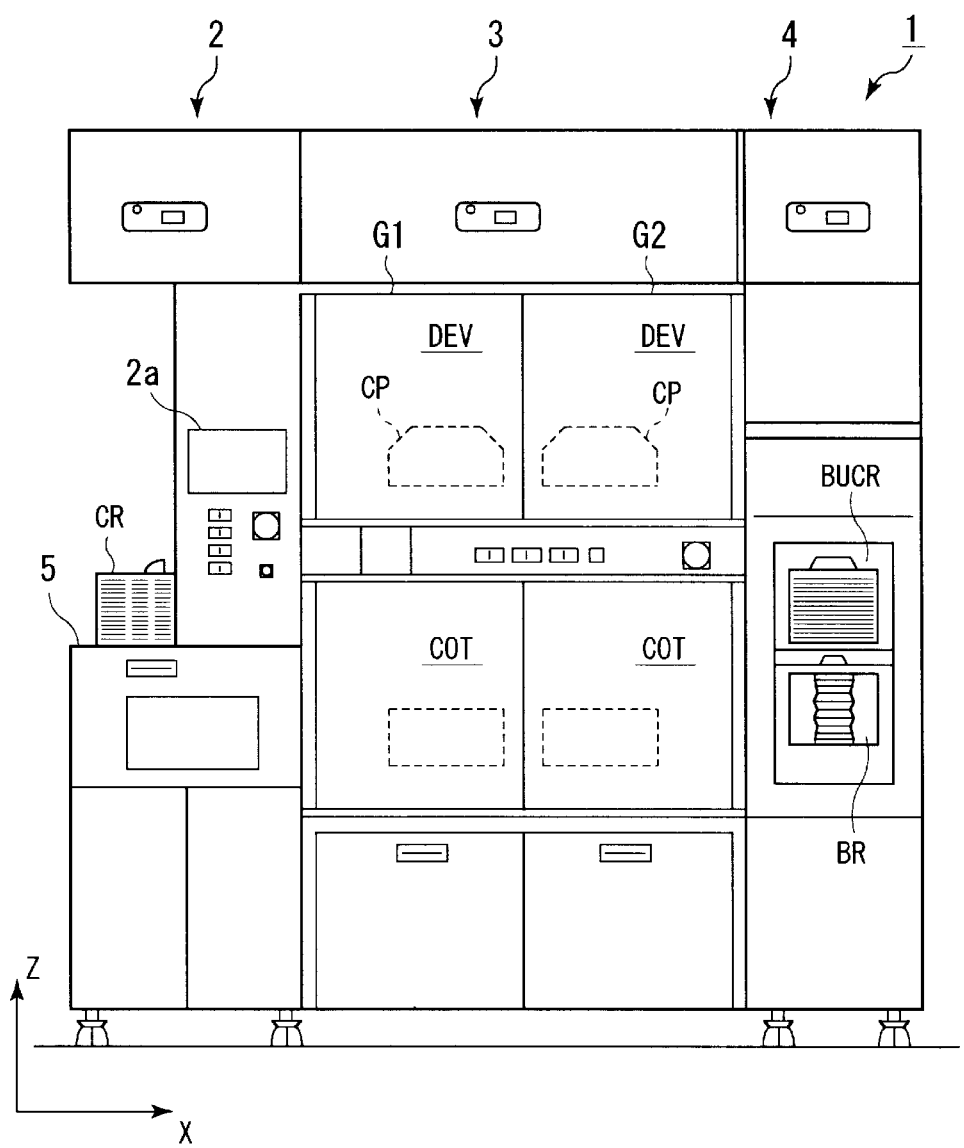
FIG. 2 is a front view showing the substrate processing system according to the first embodiment of the present invention.
Figure 3:
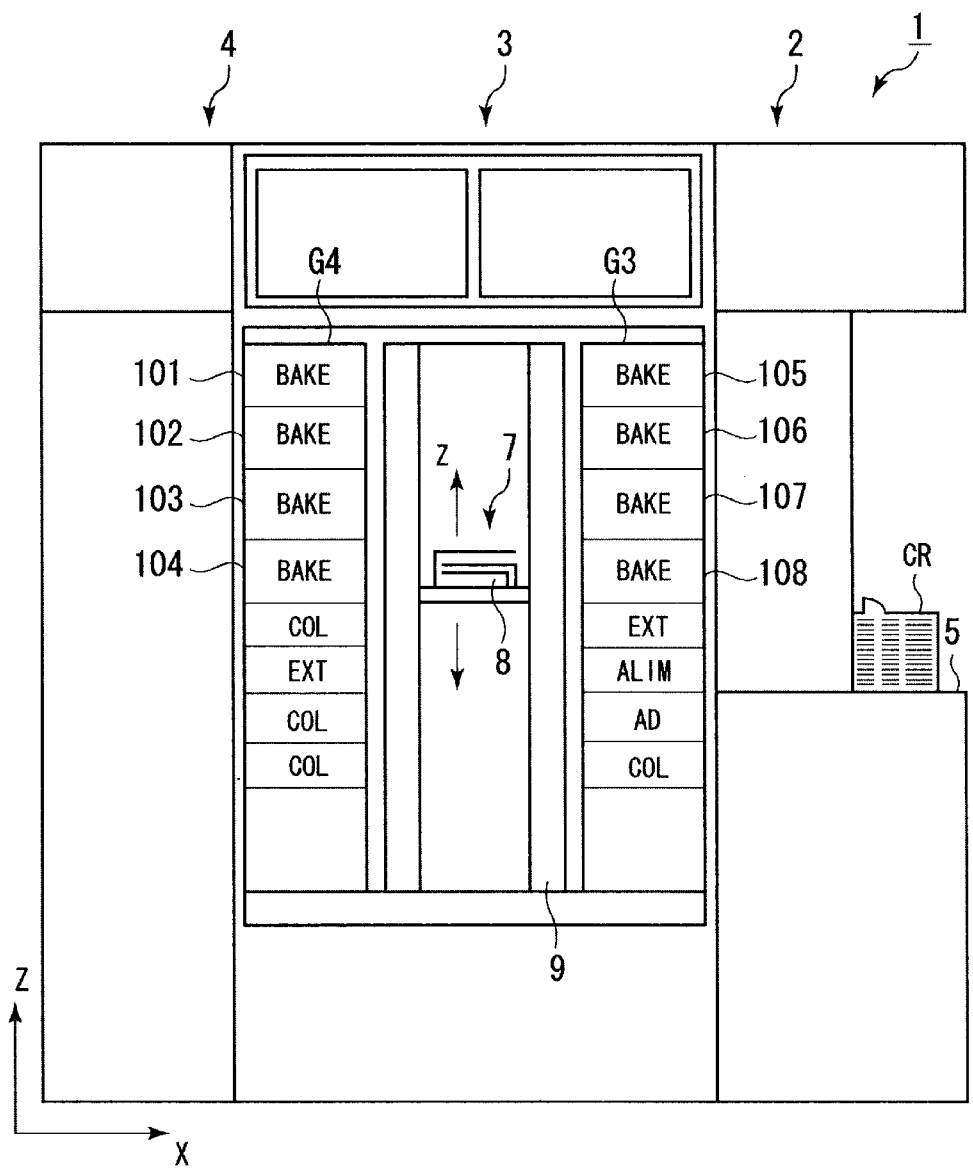
FIG. 3 is a rear view showing the structure of the substrate processing system according to the first embodiment of the present invention.

FIGS. 1 to 3 are schematic diagrams showing the overall structure of a substrate processing system 1 according to a first embodiment of the present invention. The substrate processing system 1 comprises a loading/unloading portion 2, a processing portion 3, and an interface portion 4. The loading/unloading portion 2 successively extracts wafers W from a cassette CR. The processing portion 3 performs a resist solution coating process and a developing process for a wafer W extracted from the cassette CR by the loading/unloading portion 2. The interface portion 4 transfers the wafer W that has been coated with a resist solution to an exposing device 12. The interface portion 4 has a second sub-arm mechanism 10. The second sub-arm mechanism 10 exchanges the wafer W with the exposing device 12. The loading/unloading portion 2 has a holding table 5 on which a semiconductor wafer W is extracted and returned from/to a cassette CR.

As shown in FIG. 1, in the loading/unloading portion 2, a plurality of (for example, up to four) cassettes CR are placed at alignment protrusion portions 5a on the holding table 5 so that wafer access openings thereof face the processing portion 3. Referring to FIG. 1, the cassettes CR are arranged in the X direction. A first sub arm mechanism 6 can be moved in the cassette CR arrangement direction (X direction) and the wafer W arrangement direction (Z-direction: vertical direction) so as to selectively access each cassette CR. The first sub arm mechanism 6 can access four stages 5-1 to 5-4 on the holding table 5.

In addition, the first sub arm mechanism 6 can be rotated in the θ direction so that a wafer W is exchanged with a main arm mechanism 7 disposed in the processing portion 3. In addition, as will be described later, the first sub arm mechanism 6 can access an alignment unit (ALIM) and an extension unit (EXT) of a multi-staged unit portion of a third processing unit group G3 of the processing portion 3.

A wafer W is exchanged between the loading/unloading portion 2 and the processing portion 3 through the third processing unit group G3. As shown in FIG. 3, the third processing unit group G3 is composed of a plurality of processing units that are vertically arranged. The third processing unit group G3 is composed of a cooling unit (COL), an adhesion unit (AD), an alignment unit (ALIM), an extension unit (EXT), and four baking units (BAKE 101 to BAKE 104). The cooling unit (COL) performs a cooling process for a wafer W. The adhesion unit (AD) performs a hydrophobic process for a wafer W so as to improve the fixing characteristic of a resist solution against the wafer W. The alignment unit (ALIM) aligns a wafer W. The extension unit (EXT) causes a wafer W to wait for the next process. The baking units (BAKE 101 to BAKE 104) perform various heating processes (PREBAKE, PEBAKE, and POBAKE).

A wafer W is exchanged with the main arm mechanism 7 through the extension unit (EXT) or the alignment unit (ALIM).

In addition, as shown in FIG. 1, first to fifth processing unit groups G1 to G5 including the third processing unit group G3 are disposed around the main arm mechanism 7. As with the above-described third processing unit group G3, each of the processing unit groups G1, G2, G4, and G5 is composed of various types of processing units that are vertically arranged.

On the other hand, as shown in FIG. 3, the main arm mechanism 7 is composed of a cylindrical guide 9 and a main arm 8. The main arm 8 can be vertically moved along an inner portion of the cylindrical guide 9. The cylindrical guide 9 is connected to the rotating shaft of a motor (not shown). The motor rotates the main arm 8 around the rotating shaft. Thus, the main arm 8 can be rotated in the θ direction. Alternatively, the cylindrical guide 9 may be connected to another rotating shaft (not shown) rotated by another motor (not shown). As was described above, by vertically moving the main arm 8, it can access each processing unit of the processing unit groups G1 to G5 so as to load/unload a wafer W thereto/therefrom.

As shown in FIG. 3, the fourth processing unit group G4 is composed of two cooling units (COL), an extension unit (EXT), a cooling unit (COL), and four baking units (BAKE 101 to BAKE 104) that are vertically arranged in succession from the bottom to the top.

The fifth processing unit group G5 is optionally disposed. In the example, the structure of the fifth processing unit group G5 is the same as the structure of the fourth processing unit group G4. The fifth processing unit group G5 is movably held along a rail 11 so that the main arm mechanism 7 and the first to fourth processing units G1 to G4 can be easily maintained.

When the present invention is applied to the substrate processing system shown in FIGS. 1 to 3, since individual processing units are vertically arranged, the installation space of the units can be remarkably reduced.

Figure 4:
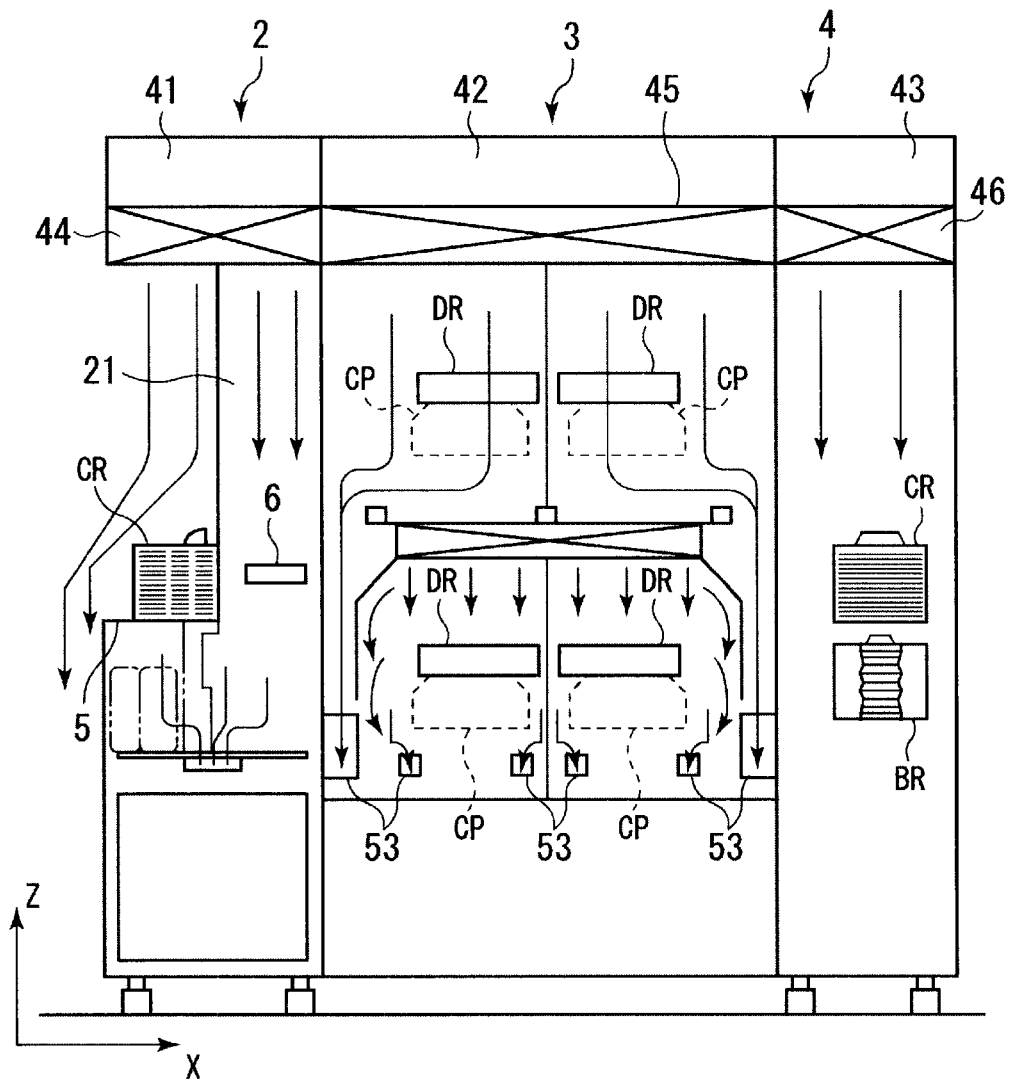
FIG. 4 is an exploded view showing a flow of clean air in the substrate processing system according to the first embodiment of the present invention.

The substrate processing system 1 is disposed in a clean room in which clean air flows downwards. Next, with reference to FIGS. 4 and 5, the flow of clean air in the substrate processing system 1 will be described. As shown in FIG. 4, clean air flows downwards in the substrate processing system 1. Thus, the cleanness of each unit of the substrate processing system 1 is improved. The system 1 has air supply chambers 41, 42, and 43 disposed above the loading/unloading portion 2, the processing portion 3, and the interface portion 4, respectively. ULPA filters 44, 45, and 46 are disposed below the air supply chambers 41, 42, and 43, respectively. Each of the ULPA filters 44, 45, and 46 has a dust protecting function.

Figure 5:
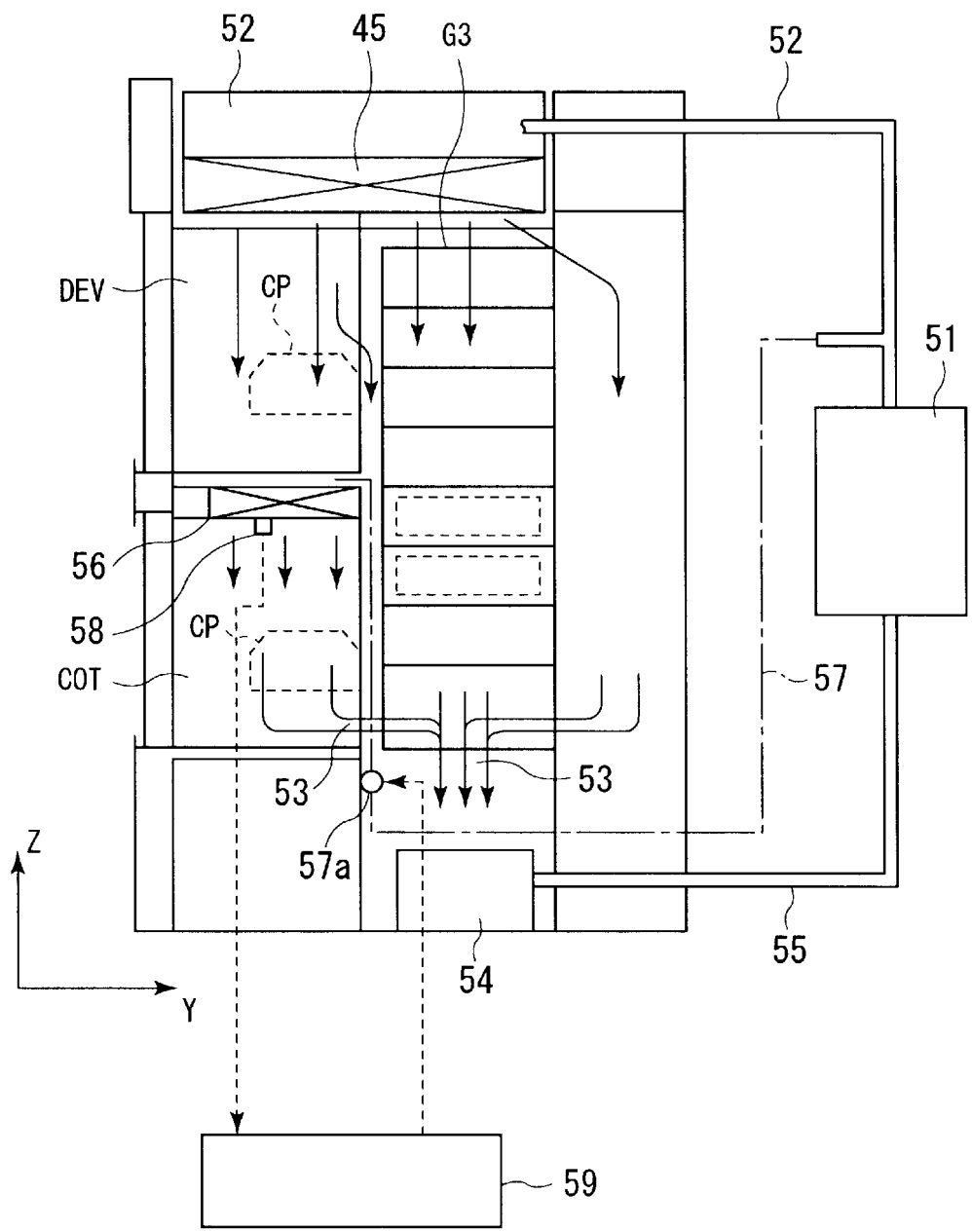
FIG. 5 is an exploded view showing a flow of clean air in the substrate processing system according to the first embodiment of the present invention.

In addition, as shown in FIG. 5, an air conditioner 51 is disposed outside or in the rear of the substrate processing system 1. The air conditioner 51 supplies air to the air supplying chambers 41, 42, and 43 through a pipe 52. Clean air purified by the ULPA filters 44, 45, and 46 of the individual air supplying chambers 41, 42, and 43 is supplied as down flow air to the individual portions 2, 3, and 4, respectively. The down flow air is gathered to an exhaust opening 54 at the bottom of the system through air holes 53 formed at many positions of the system 1. The air gathered to the exhaust opening 54 is collected by the air conditioner 51 through a pipe 55.

In the processing portion 3, ULPA filters 56 are disposed on the ceilings of resist coating units (COT) disposed in lower stages of the multi-staged units of the first and second processing unit groups G1 and G2. Air is supplied from the air conditioner 51 to the ULPA filters 56 through a pipe 57 branched from the pipe 52. A temperature/humidity adjusting device 57a is disposed in the middle of the pipe 57. Clean air with predetermined temperature and humidity suitable for the resist coating process is supplied to the resist coating units (COT). A humidity/temperature sensor 58 is disposed on the air blow side of each of the ULPA filters 56. An output signal of the sensor is sent to a controller 59 that controls the temperature/humidity adjusting device 57a so that it accurately controls the temperature and humidity of the clean air on feedback basis.

Referring to FIG. 4, openings DR are formed on side walls of the spinner type processing units (COT) and (DEV) facing the main arm mechanism 7 so that a wafer W and a conveying arm are accessed. Each of the openings DR has a shutter (not shown) that prevents particles and so forth from entering from each unit to the main arm mechanism 7.

The air conditioner 51 controls the amount of air that is supplied to and exhausted from a conveying chamber 21 so that the inner pressure of the conveying chamber 21 is higher than the inner pressure of the clean room. Thus, air does not flow from the inside of the clean room and a cassette CR to the conveying chamber 21. As a result, particles do not enter the conveying chamber 21. In addition, the inner pressure of the processing portion 3 is higher than the inner pressure of the conveying chamber 21. Thus, air does not flow from the conveying chamber 21 to the processing portion 3. As a result, particles do not enter the processing portion 3.

Figure 6A:
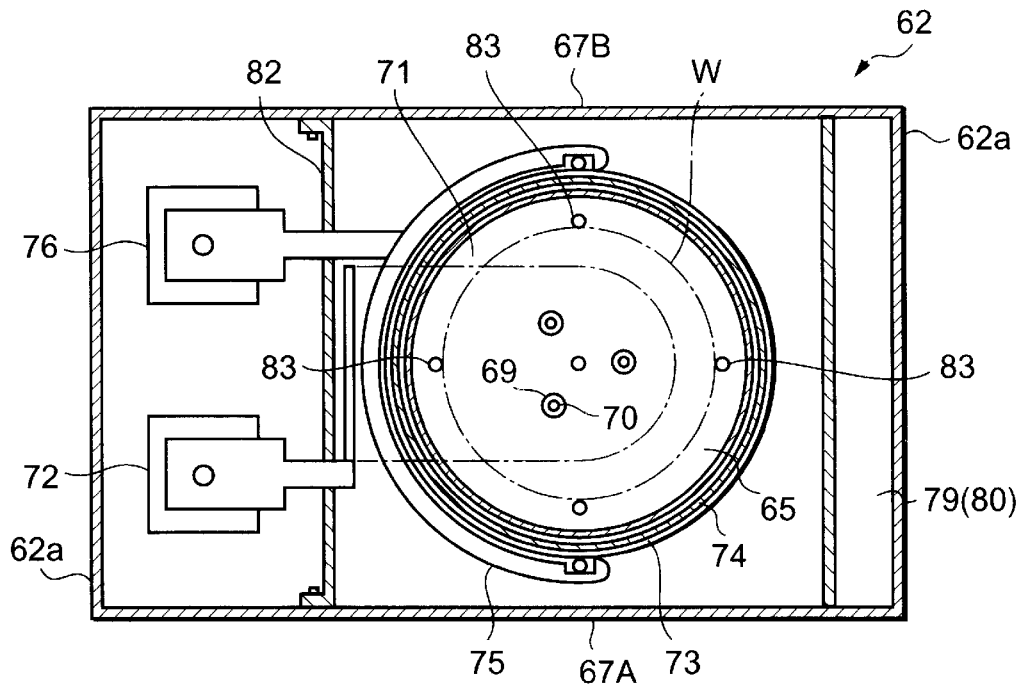
FIGS. 6A and 6B are schematic diagrams showing the overall structure of a heat processing unit of the substrate processing system according to the first embodiment of the present invention.
Figure 6B:
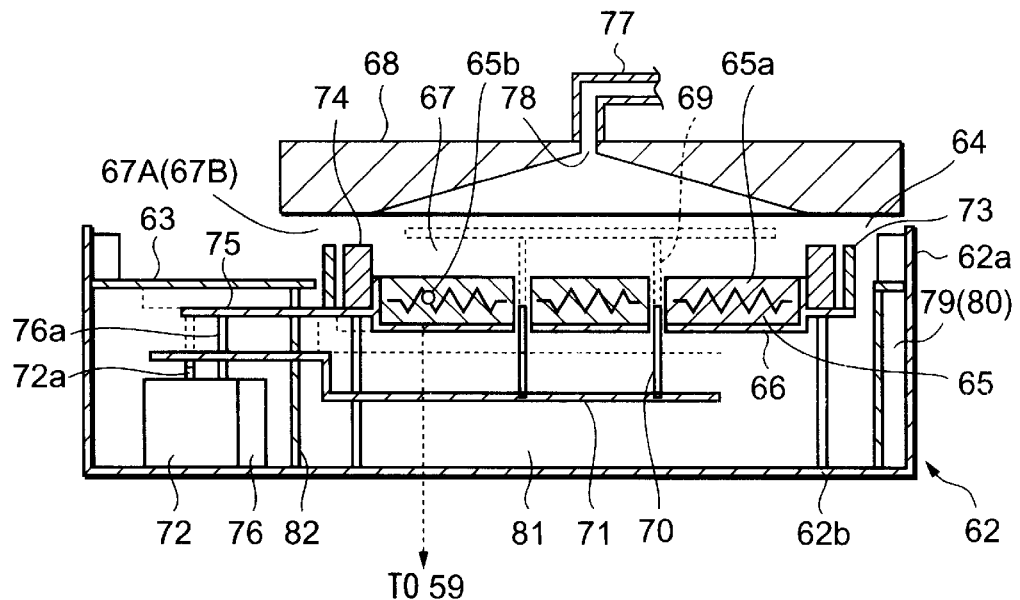

FIGS. 6A and 6B are a plan view and a vertical sectional view showing the overall structure of a heat processing unit (BAKE) disposed in the processing portion 3 of the substrate processing system 1.

As shown in FIG. 6, the heat processing unit (BAKE) has a base block 62. The base block 62 is formed in a concave shape. The base block 62 are composed of a base block side portion 62a and a base block bottom portion 62b. A horizontal shielding plate 63 has a predetermined height against the base block side portion 62a and is disposed in parallel with the base block bottom portion 62b. A circular opening 64 is formed in the horizontal shielding plate 63. A hot plate 65 as a heating mechanism is disposed in the opening 64. The hot plate 65 is supported by a supporting plate 66 on the horizontal shielding plate 63.

A process chamber 67 as a chamber for a heating process is composed of the base block side portion 62a, the horizontal shielding plate 63, and a cover 68. An opening 67A and an opening 67B are formed at the front and rear of the process chamber 67, respectively. A wafer W is loaded to and unloaded from the process chamber 67 through the opening 67A and the opening 67B, respectively.

The hot plate 65 has three through holes 69. Three lift pins 70 as a wafer W holding jig are inserted into the holes 69. The three lift pins 70 are connected and supported by an arm 71. The arm 71 is connected and supported by for example a rod 72a of a vertical cylinder 72. When the rod 72a is extended from the vertical cylinder 72, the lift pins 70 are extended so that the wafer W is raised from the hot plate 65.

The height of the lift pins 70 that support the wafer W at three points can be adjusted. When the lift pins 70 are placed in a low level denoted by a solid line, the lift pins 70 do not protrude from the hot plate 65. Thus, theoretically, the distance between the wafer W held by the lift pins 70 and the front surface of the hot plate 65 is 0 mm. However, the proximity of the distance of the real structure is around 0.1 mm. In a high level denoted by a dotted line, the lift pins 70 protrude from the front surface of the hot plate 65 by for example 18 mm. In the high level, the main arm mechanism 7 exchanges a wafer W with other processing units.

As shown in FIG. 6B, a ring-shaped shutter 73 is disposed on the outer periphery of the hot plate 65. The shutter 73 is held by a rod 76a of a vertical cylinder 76 through an arm 75 so that the shutter 73 is raised and lowered. When a wafer W is not processed, the shutter 73 is lowered. When a wafer W is processed, the shutter 73 is raised and placed between the hot plate 65 and the cover 68. A supplying ring 74 is disposed on the inner periphery of the shutter 73 so that the supplying ring 74 surrounds the hot plate 65. In the state that the shutter 73 is raised, nitrogen gas or air (cooling gas) blows from many air holes (not shown) formed in the supplying ring 74. The air holes are pitched with for example 2° of center angle along the periphery of the shutter 73.

An exhaust opening 78 is formed at the center of the cover 68. The exhaust opening 78 is connected to an exhaust pipe 77. The exhaust opening 78 exhausts gas that occurs in the heating process through the exhaust opening 78. The exhaust pipe 77 is connected to a duct 79 (or 80) disposed in the front of the system or to another duct (not shown).

A machine chamber 81 is disposed below the horizontal shielding plate 63. The machine chamber 81 is composed of the side walls of the duct 79, a side wall 82, and the base block bottom portion 62b. In the machine chamber 81, for example, the supporting plate 66, the shutter arm 75, the lift pin arm 71, the vertical cylinder 72, and the vertical cylinder 76 are disposed.

As shown in FIG. 6A, for example four protrusions 83 are formed on the upper surface of the hot plate 65. The four protrusions 83 aligns a wafer W. In addition, a plurality of small protrusions (not shown) are formed on the upper surface of the hot plate 65. When a wafer W is placed on the hot plate 65, the edges of the small protrusions contact the wafer W. Thus, a small gap (around, 0.1 mm) is formed between the wafer W and the hot plate 65. As a result, the lower surface of the wafer W is prevented from being dirtied or scratched.

A deviation of temperatures in the heating process (namely, a deviation between a target temperature and a temperature in the real process) is permitted as long as it does not adversely affect the quality of semiconductor devices as final products. However, when a wafer W is heat-processed at a temperatures that deviates from the permissible range, a desired resist film cannot be formed. To prevent that, the temperature of the hot plate 65 is detected by a sensor 65*b* disposed in the hot plate 65. Corresponding to the detected temperature, the amount of power supplied to a heater 65*a* composed of for example a thermocouple is controlled on feed-back basis. The sensor 65*b* is connected to the controller 59.

Figure 7:
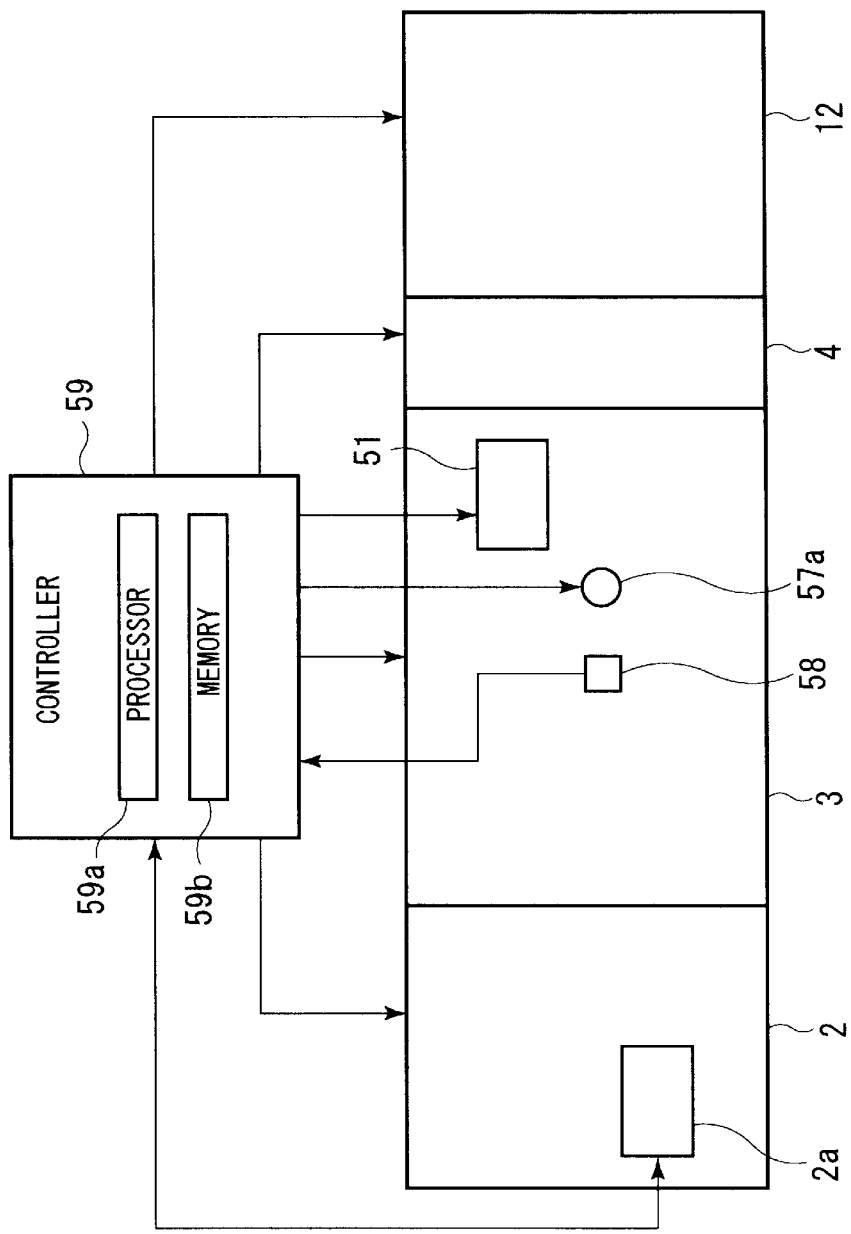
FIG. 7 is a block diagram showing a control of the substrate processing system according to the first embodiment of the present invention.

FIG. 7 is a block diagram showing a control of the substrate processing system 1. A main panel 2*a* is disposed on the front wall of the loading/unloading portion 2. The main panel 2*a* is used to control and operate the entire system such as a recipe setting operation, a wafer flow registering operation, and an alarm generating operation. The main panel 2*a* is of touch sensor type. When the operator operates the substrate processing system 1, he or she touches an input portion on the screen of the main panel 2*a* with a touch pen.

The main panel 2*a* is connected to the controller 59. Data of a recipe that is input on the main panel 2*a* is output to the controller 59. The controller 59 sends control commands for individual portions corresponding to data of a recipe and so forth to the loading/unloading portion 2, the processing portion 3, the interface portion 4, and the exposing device 12 so as to control them. Referring to FIG. 7, the controller 59 is disposed outside the substrate processing system 1. In reality, the controller 59 is disposed in the loading/unloading portion 2.

A processor 59*a* and a memory 59*b* are disposed in the controller 59. The processor 59*a* calculates for example a process completion prediction time. In addition, the processor 59*a* performs various calculation processes such as temperature and humidity controls of the processing portion 3.

In this example, the process completion prediction time is a concept that includes a first process completion prediction time, a second process completion prediction time, and a third process completion prediction time. The first process completion prediction time is a prediction time after the first wafer W of one lot is conveyed to the processing portion 3 until the first wafer W is returned to the loading/unloading portion 2. The second process completion prediction time is a prediction time after the first wafer W of one lot is conveyed to the processing portion 3 until the last wafer W of the same lot is conveyed to the processing portion 3. The third process completion prediction time is a completion prediction time after the first wafer W of one lot is conveyed from the loading/unloading portion 2 to the processing portion 3 until the last wafer W of the same lot is returned to the loading/unloading portion 2. Wafers W that are successively extracted from one cassette CR and processed are referred to as one lot.

The process completion prediction times are calculated corresponding to process completion prediction functions stored in for example the memory 59*b*. Alternatively, recipes of past processes and process completion prediction time data thereof may be stored in the memory 59*b* instead of the process completion prediction functions. The process completion prediction times may be calculated by the processor 59*a* corresponding to the past data. In that case, if past data does not contain a recipe to be processed, the process completion prediction times can be calculated using one or more similar recipes.

In the case that a plurality of wafers W are processed in individual processing units in parallel, that when cycle time periods (T1, T2, . . . ) of individual lots are obtained in a regular state of which one processing unit is affected by another processing unit, and that a process time period in a transient state of which one processing unit is not affected by another processing unit, the process completion prediction times can be calculated with information of a process recipe. The time period (T1, T2, . . . ) of one cycle of each lot is preferably designated corresponding to a required time period for one unit that affects the process and that requires the longest time period as one of process conditions thereof.

In the case, the transient state is set corresponding to the time period for which a wafer W of the first lot is processed by a predetermined unit. Thereafter, the regular state is set in such a manner that the first lot is processed in the T1 cycle time period, the second lot is processed in the T2 cycle time period, the third lot is processed in the T3 cycle time period, . . . , and the S-th lot is processed in the Ts cycle time period.

In addition, in the regular state, a change of the cycle time period from Ts to Ts+1 preferably depends on which of cycle time periods Ts and Ts+1 is longer or shorter.

In the case of Ts<Ts+1, when the first wafer W of the second lot is supplied to the processing portion 3 (in other words, the second process completion prediction time of the first lot) is a time at which the cycle time period changes. In other words, in the second lot whose cycle time period is long, if the second lot is processed in the shorter cycle time period Ts, the second cycle is adversely affected.

In the case of Ts>Ts+1, when the last wafer W of the first lot is returned from the processing portion 3 to a cassette CR (namely, the third process completion prediction time of the first lot) is a time at which the cycle time period changes.

Figure 8:
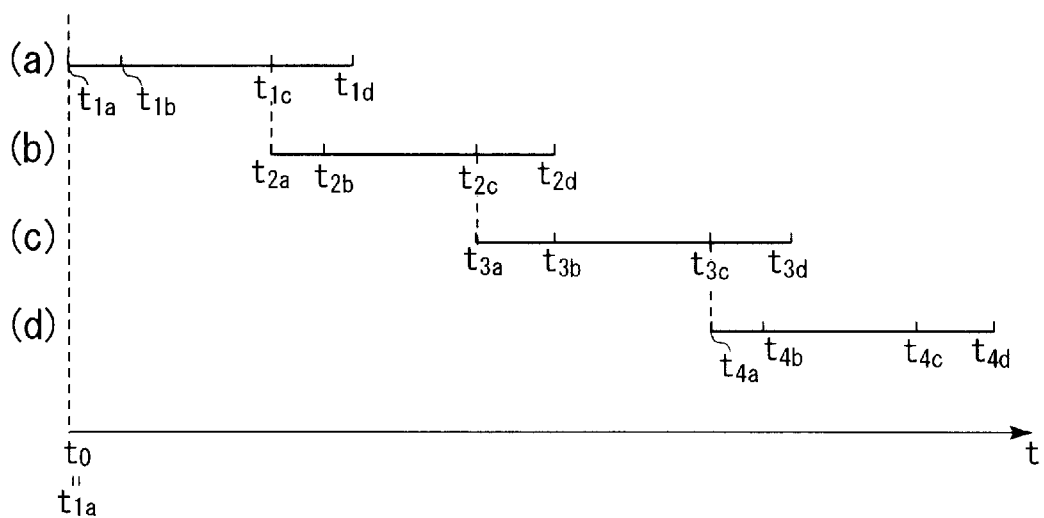
FIG. 8 is a timing chart showing first to fourth lots of the substrate processing system according to the first embodiment of the present invention.

Next, with reference to FIG. 8 that shows an example of a timing chart of real processes from the first to fourth lots, the calculating methods for the first to third process completion prediction times will be described. In FIG. 8, (*a*) to (*d*) show required time periods (t1*a* to t1*d*, t2*a* to t2*d*, t3*a* to t3*d*, and t4*a* to t4*d*) of the first to fourth lots, respectively. A required time period is a time period after the first wafer W of one lot is extracted from a cassette CR and conveyed to the processing portion 3 until all wafers of the same lot are returned to a cassette CR.

In FIG. 8, t1*a*, t2*a*, t3*a*, and t4*a* represent times at which wafers W of individual lots are conveyed to the processing portion 3. In FIG. 8, t1*b*, t2*b*, t3*b*, and t4*b* represent times at which the first wafers W of the individual lots that have been processed in the processing portion 3 are returned to the respective cassettes CR. In FIG. 8, t1*c*, t2*c*, t3*c*, and t4*c* represent times at which all wafers W of the individual lots are conveyed to the processing portion 3. In FIG. 8, t1*d*, t2*d*, t3*d*, and t4*d* represent times at which all wafers W of the individual lots are returned from the processing portion 3 to the individual cassettes CR. In FIG. 8, the first process completion prediction time is denoted by tb. The second process completion prediction time is denoted by tc. The third process completion prediction time is denoted by td.

As shown in the timing chart, the four cassettes are handled so that the relations of t1c=t2a, t2c=t3a, and t3c=t4a are satisfied. Corresponding to the relations, at the time of which the first wafer W of the first lot is processed, the absolute process completion prediction times of all the lots can be calculated starting from the successive lot process start time. In other words, the following relations are satisfied. (Absolute process completion prediction time of second lot)=(second process completion prediction time of first lot)+(process completion prediction time of second lot); (absolute process completion prediction time of third lot)= (second process completion prediction time of first lot)+ (second process completion prediction time of second lot); and (absolute process completion prediction time of fourth lot)=(second process completion prediction time of first lot)+(second process completion prediction time of second lot)+(third process completion prediction time of third lot).

Thus, it is clear that the absolute process completion prediction time of the k-th lot is expressed as tkα=t1c+t2c+ ... +tk. Thus, the first process completion prediction time of the k-th lot is expressed as tkα(1)=t1c+t2c+ ... +tkb. The second process completion prediction time of the k-th lot is expressed as tkα(2)=t1c+t2c+ ... +tkc. The third process completion prediction time of the k-th lot is expressed as tkα(3)=t1c+t2c+ ... +tkd.

Figure 9:
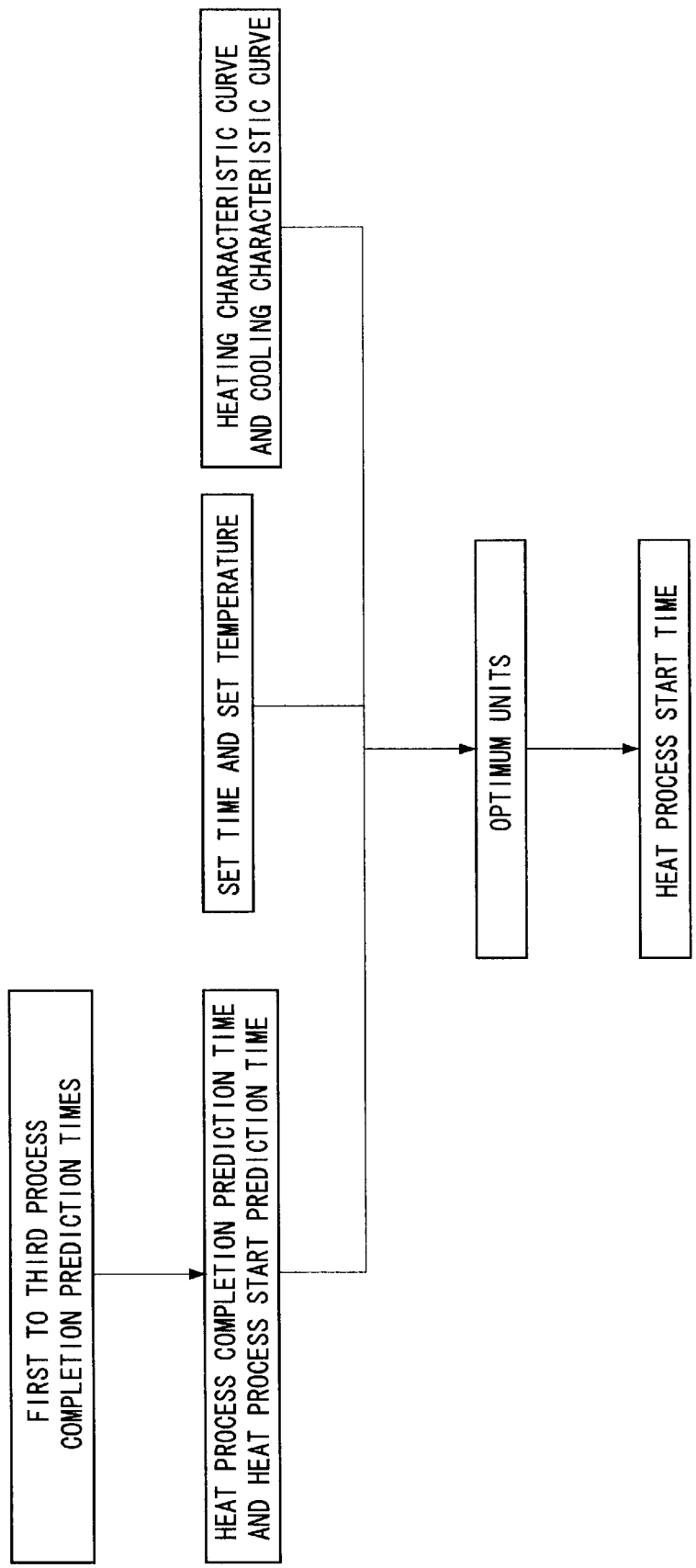
FIG. 9 is a flow chart showing data of a processor according to the first embodiment of the present invention.

The processor 59a selects a proper heat processing unit corresponding to the first process completion prediction time, the second process completion prediction time, and the third process completion prediction time that have been calculated in such a manner. FIG. 9 is a flow chart showing data for which the processor 59a selects an optimum unit corresponding to the first to third process completion prediction times. The heat process completion prediction time represents a time at which each heat processing unit completes the heat process for the last wafer W of the objective lot. The heat process start prediction time represents a time at which each heat processing unit starts the heat process for the first wafer W of the objective lot. The state "the heat process is completed" means the state that a wafer W is placed on the hot plate 65, the lift pins 70 are lifted up, and then the wafer W is separated from the hot plate 65. The state "the heat process is started" means the state that a wafer W is placed on the hot plate 65, the lift pins 70 is lifted down, and then the wafer W substantially contacts the hot plate 65.

Set time and set temperature are set for each lot and for each heat processing unit. An optimum unit means an unit selected by the processor 59a so as to accomplish a desired heat characteristic in the shortest time. A heat process start time means a time at which the power is supplied to the heater 65a shown in FIG. 6B.

As shown in FIG. 9, the processor 59a calculates the heat process completion prediction time and the heat process start prediction time for each processing unit and for each lot corresponding to the first to third process completion prediction times. The processor 59a selects optimum units that accomplish a set temperature in shorter time periods corresponding to the heat process completion prediction time, the heat process start prediction time, the set temperature and set time of each heat processing unit, and heating and cooling characteristic curves stored in the processor 59a.

The operator can designate the number of units that are selected. When there are a plurality of units to be selected, a plurality of units that accomplish the set temperature in shorter time periods are selected in order. When used units cannot accomplish the set temperature in a required time period for the next lot, optimum units are selected from unused units.

Figure 10A:
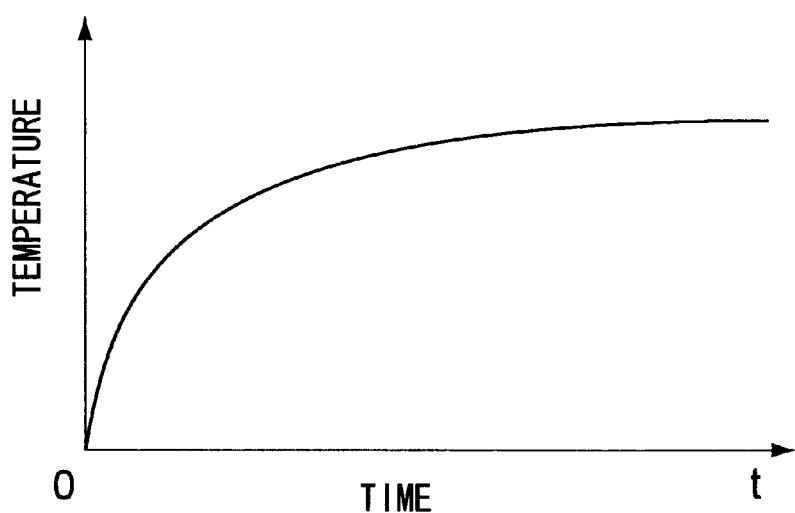
FIGS. 10A and 10B are graphs showing heating and cooling characteristic curves of the heat processing unit according to the first embodiment of the present invention.
Figure 10B:
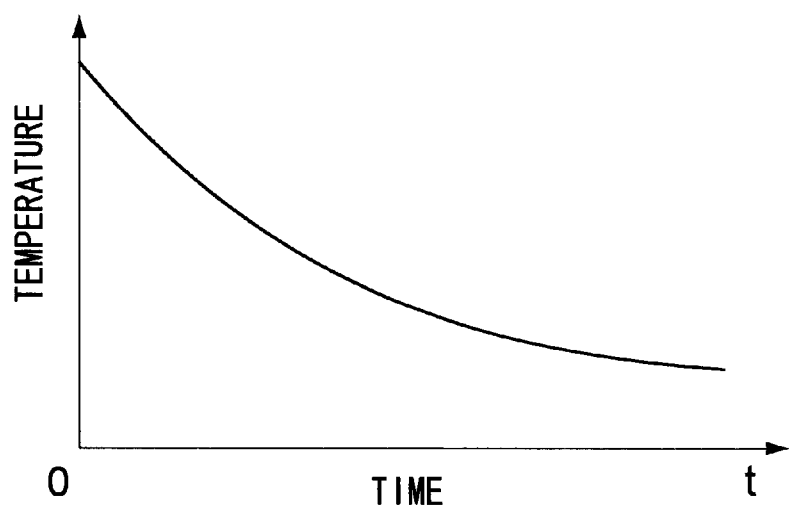

Heat processing units are selected as follows. The memory 59b stores heating and cooling temperature characteristic curves shown in FIGS. 10A and 10B, respectively. FIG. 10A shows the temperature characteristic curve in the case that a wafer W is heated in a heat processing unit. FIG. 10B shows the temperature characteristic curve in the case that a wafer W is cooled in a heat processing unit. These temperature characteristic curves are obtained from temperature change data in past heat processes, design specifications of the unit that is used, and so forth. FIG. 10A shows an example of the characteristic curve. In reality, the memory 59b stores a plurality of characteristic curves having a plurality of startup temperatures. At the same time, the memory 59b stores a plurality of characteristic curves having a plurality of temperature at the completion of the process. After each heat process is completed, the power supplied to the heater 65a of the heat processing unit is stopped. Thus, corresponding to the cooling characteristic curve shown in FIG. 10B, the temperature of the unit lowers. After the temperature lowers to a predetermined value, the power is supplied to the heater 65a. As a result, the temperature of the unit rises corresponding to the heating characteristic curve shown in FIG. 10A.

Next, in the case that four lots are successively processed, the processing unit selecting operation for selecting a prebaking unit (PREBAKE), a post-exposure baking unit (PEBAKE), and a post-baking unit (POBAKE) for the second to fourth lots from eight heat processing units (BAKE) 101 to 108 shown in FIG. 11A will be described.

In such a case, it is assumed that process conditions shown in FIG. 12 have been set by an input of the operator or have been automatically set by the processor 59a. The process conditions contain the number of processing units, set temperature, and set time for each baking unit.

FIG. 11B show assignments of the baking units 101 to 108 for the first lot. Referring to FIG. 11B, the baking units 101 to 104 are assigned to the first lot, whereas the baking units 105 to 108 are not assigned to the first lot (not used).

As shown in FIG. 11B, in the processes for the first lot, the pre-baking (PREBAKE) process is performed by the baking unit 104 with 120° C. of temperature and 30 sec of process time, the post-exposure baking (PEBAKE) process is performed by the baking unit 103 with 150° C. of process temperature and 30 sec of process time, and the post-baking (POBAKE) process is performed by the baking units 101 and 102 with 180° C. of process temperature and 40 sec of process time.

Figure 13A:
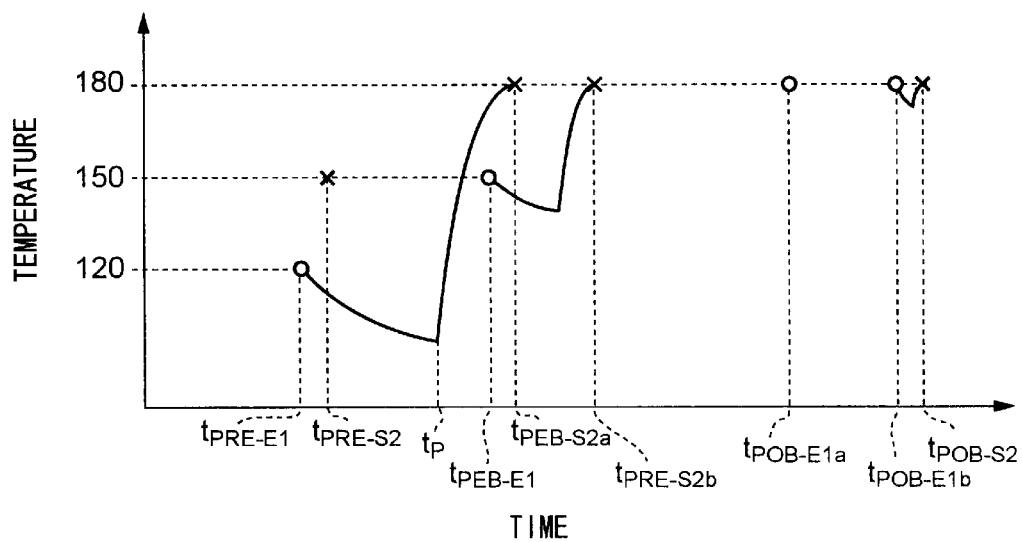
FIGS. 13A and 13B are graphs for explaining the selecting operation of heat processing units according to the first embodiment of the present invention.

FIG. 13A shows process conditions that have been set in the above-described manner and the process completion prediction time and process start prediction time for each heat processing unit obtained corresponding to the above-described process completion prediction time.

Referring to FIG. 13A, tPRE-E1, tPEB-E1, tPOB-E1, and tPOB-E2 represent process completion prediction times as the process completion prediction time of the pre-baking process, the process completion prediction time of the post exposure baking process, and the process completion prediction times of the post-baking process of the first and second units for the last wafer W of the first lot, respectively.

Referring to FIG. 13A, tPRE-S2, tPEB-S2a, tPEB-S2b, and tPOB-S2 represent process start times as the process start prediction time of the pre-baking process, the process start prediction times of the post-baking processes of the first and second units, and the process start prediction time of the post-baking process for the first wafer W of the second lot.

The process start prediction time and the process completion prediction time of each unit for each lot can be calculated corresponding to the first process completion prediction time, the second process completion prediction time, and the third process completion prediction time and the cycle time periods T1, T2, and so forth. When the process start prediction time of the pre-baking process for the second lot is calculated, assuming that the number of processing units that are performed until the pre-baking process for one cycle each is three and the relation of T1>T2 is satisfied, t1α(2)+3T1 of which the three cycle time periods for the first lot are added to the second completion prediction time for the first lot becomes the process start prediction time of the pre-baking process for the second lot.

When the process completion prediction time of the post-baking process for the second lot is calculated, the number of processing units performed until the post-exposure baking process for one cycle each is nine and the relation of T1>T2 is satisfied, a time period of which nine cycles and 40 sec of the set time of the post-baking process for the second lot are added to the second process completion prediction time of the second lot (namely, t1α(2)+9T1+ 40 (sec)) becomes the process completion prediction time of the post-baking process for the second lot. Likewise, the process start prediction time and the process completion prediction time for each lot and for each processing unit can be calculated.

As shown in FIG. 13A, the processor 59a selects units that accomplish the set temperature in shorter time periods from units that have completed processes at a predetermined temperature at the process completion prediction times of the individual processes (denoted by O) for the first lot until the process start prediction times of the individual processes (denoted by X) for the second lot elapse.

In such a selecting method, it is determined whether or not processes for the preceding lot have been completed until the process start prediction time of a particular heat process elapses and whether or not an unit that accomplishes the set temperature until the process start prediction time of a particular heat process elapses can be selected from units that have completed the processes of the preceding lot. Thereafter, units that accomplish a desired heat characteristic in shorter time periods are selected successively from those units.

For example, it is assumed that the first wafer W of the second lot should be processed at the time tPRE-S2 at 150° C. In this case, it is determined whether or not an unit that has processed the wafer W at the time tPRE-E1 at 120° C. can accomplish the temperature of the first pre-baking process for the second lot. However, the temperature of the pre-baking process for the second lot cannot be accomplished by the time tPRE-S2. This is because the wafer W is heated after the time tPRE-S2 until the time tPRE-E1, the heating characteristic curve shown in FIG. 10A represents that the unit cannot accomplish 150° C. Thus, the unit that has performed the pre-baking process for the first lot cannot be used. In addition, that unit that has performed a heat process for the first lot cannot be selected because it has not completed the heat process for the last wafer at the time tPRE-S2. Thus, the pre-baking unit (PREBAKE) for the second lot is selected from the pre-baking units 105 to 108 that have not been used for the first lot.

In addition, for example, the first wafer W of the second lot should be processed at the time tPEB-S2a at 180° C. Units that have completed the processes for the first lot by the time tPEB-S2a are the pre-baking unit (PREBAKE) 104 and the post-exposure baking unit (POBAKE) 103. The processor 59a determines which of the pre-baking unit (PREBAKE) 104 and the post-exposure baking unit (POBAKE) 103 accomplishes a temperature closest to 180° C. Corresponding to the heating and cooling characteristic curves shown in FIGS. 10A and 10B, it is clear that the pre-baking unit (PREBAKE) 104 can accomplish the required temperature when it starts the heat process at the time tp. On the other hand, the post-exposure baking unit (POBAKE) 103 cannot accomplish 180° C. by the time tPEB-S2a. Thus, the pre-baking unit (PREBAKE) 104 that has performed the post-exposure baking process for the first lot can be selected as a first unit that performs the post-exposure baking process for the second lot.

In such a selecting method, the post-exposure baking unit (POBAKE) 103 that has performed the post-exposure baking process for the first lot is used as a second unit for the post-exposure baking process for the second lot. One of the units 101 and 102 that have performed the post-baking process for the first lot is used as a unit that performs the post-baking process for the second lot.

Figure 13B:
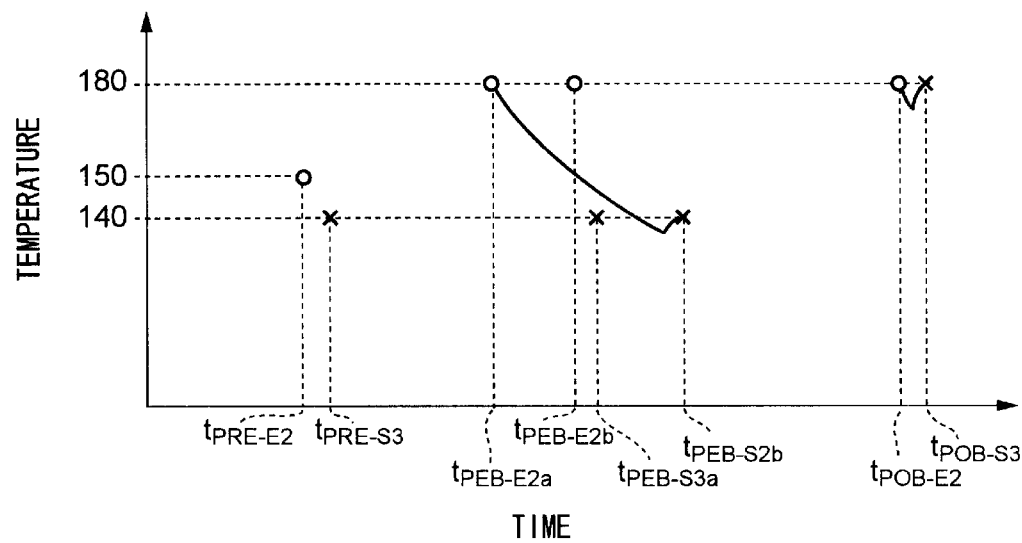

FIG. 11C shows assignments of units for the second lot. FIG. 13B shows a heating and cooling characteristic curve for which processes are changed from the second lot to the third lot. FIG. 10D shows assignments of units for the third lot selected corresponding to the result shown in FIG. 13B.

In FIGS. 13A and 13B, the time tPRE-E1 does not match the time tPRE-S2. Thus, the process completion prediction time for a particular lot deviates from the process start prediction time for the next lot. In other words, after the process completion prediction time for a particular lot elapsed, a conveying time period and a waiting time period necessary for conveying a wafer W and the like are required for the next lot.

In addition, corresponding to the heating and cooling characteristic curves shown in FIGS. 13A and 13B, the processor 59a calculates a heat process start time. In reality, the time of which the cooling characteristic curve shown in FIG. 13A and the heating characteristic curve shown in FIG. 13B intersect with the period from the process completion prediction time to the process start prediction time becomes the heat process start time. For example, the heat process start time of the pre-baking unit (PREBAKE) 105 for the second lot becomes tp. The heat process start time is stored in the memory 59b. When the predetermined heat process start time elapsed, the controller 59 causes the power to be supplied to the heater 65a of each heat processing unit.

In such a manner, the processor 59a automatically selects a heat processing unit that accomplishes a desired temperature in the shortest time for each lot and calculates the heat process start time for the selected heat processing unit.

In addition, the main panel 2a is provided with a start button. When the operator touches the start button, the substrate processes can be started. When the temperature and humidity in the substrate processing system 1 have been adjusted, the process completion prediction time and heat process start time have been calculated, or a heat processing unit has been selected, the start button blinks in blue that represents that real processes can be started.

The substrate processes performed by the processing system according to the above-described embodiment will be described with reference to a flow chart shown in FIG. 14.

First of all, the temperature and humidity in the substrate processing system 1 are raised (at step S141). In reality, a main power button (not shown) disposed on the front wall of the loading/unloading portion 2 is pressed so as to turn on the entire power of the substrate processing system 1. Thus, air starts blowing to the inside of the substrate processing system 1. As a result, the temperature and humidity in the substrate processing system 1 are adjusted.

Thereafter, a conveying recipe, a process recipe, and so forth are set on the main panel 2a (at step S142). The conveying recipe describes the contents of processes (such as an adhesion process, a developing process, and an exposing process) and the order of the processes. A recipe is set with a touch pen on the main panel 2a of the loading/unloading portion 2.

In reality, for example, steps and processing units as shown in FIG. 15 are designated. According to the above-described embodiment, all the processes are common in each of the first to fourth lots. Alternatively, the process order and processing units may be varied for each lot.

In addition, conditions for each process are designated in detail. FIG. 12 shows an example of process conditions of the heat processing system. As shown in FIG. 12, the number of units, the set temperature, and the set time period are set. FIG. 12 shows only process conditions for the heating process system. Likewise, process conditions for other solution processes may be set in detail.

In addition, when a recipe is set, the number of wafers W to be processed may be set. Alternatively, when a cassette CR is placed on the holding table 5, the number of wafers W may be automatically detected by a sensor.

When a recipe and so forth are set in such a manner, a flow of the recipe and so forth are displayed on the main panel 2a. With reference to the screen displayed on the main panel 2a, the operator determines whether or not the recipe that has been set is correct.

The operator places a cassette CR containing a predetermined number of wafers on the holding table 5 (at step S143). The loading/unloading portion 2 detects the number of wafers W contained in the cassette CR with a sensor (not shown) and outputs a detection signal to the controller 59.

On the other hand, when a recipe for processes has been correctly set with the main panel 2a, the controller 59 automatically selects a heat processing unit for each lot corresponding to the recipe and so forth and calculates the heat process start time for each unit (at step S144).

Thereafter, the operator checks that the temperature and humidity in the substrate processing system 1 have been adjusted on the main panel 2a (at step S145). The operator inputs a process start command on the main panel 2a (at step S146). Thus, a process start signal is output to the controller 59. The controller 59 causes the individual processing units to start their processes corresponding to the process start signal (at step S147).

Figure 16:
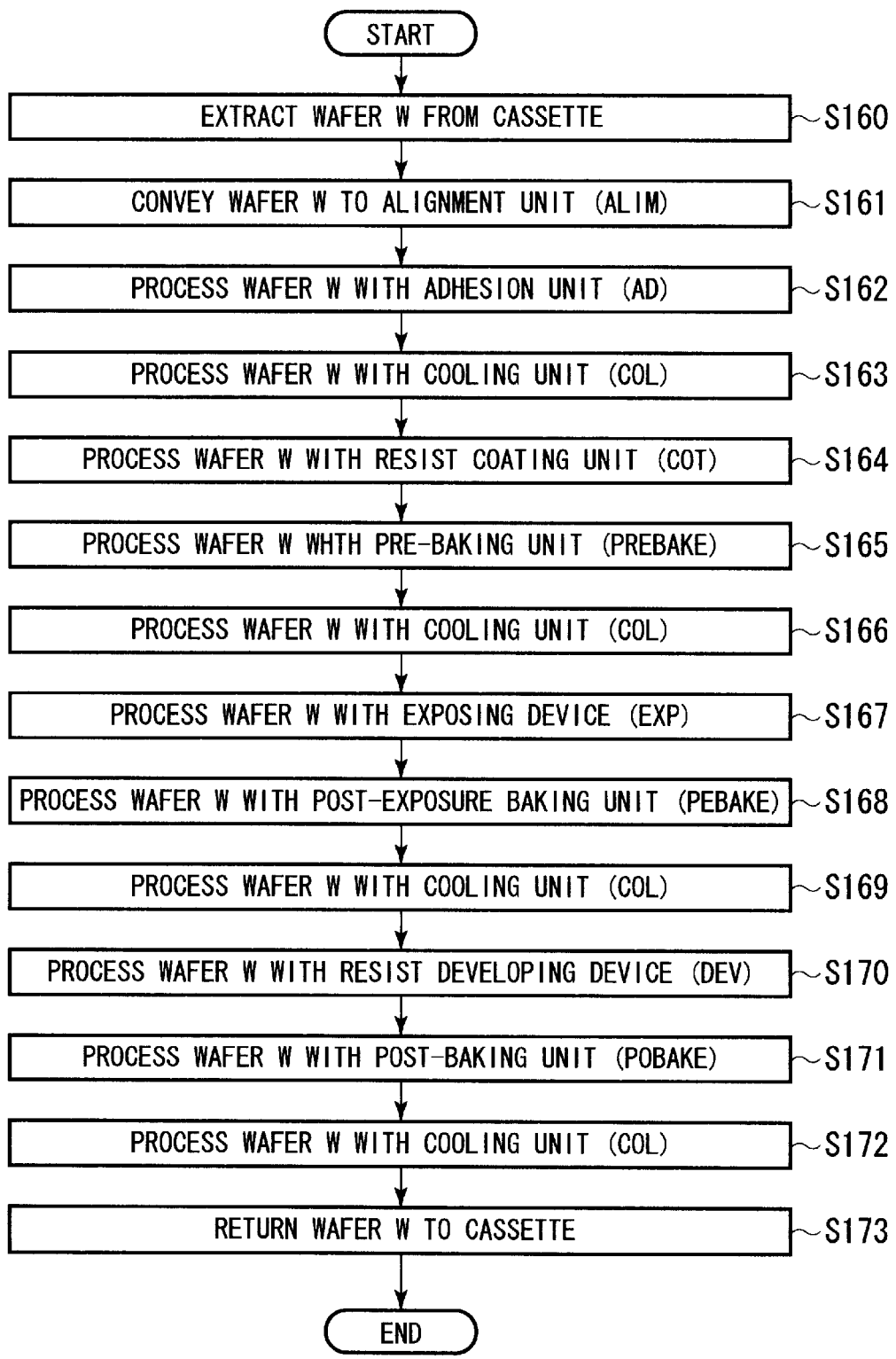
FIG. 16 is a flow chart showing real processes of individual processing units of the substrate processing system according to the first embodiment of the present invention.

FIG. 16 shows an example of a flow chart of real processes of individual processing units. Wafers W contained in a cassette CR placed on the holding table 5 of the loading/unloading portion 2 are extracted one by one by the sub arm mechanism 6 (at step S160) and conveyed to the loading/unloading portion 2 one by one (at step S161). A conveyed wafer W is moved in the X direction and conveyed to the processing portion 3. The wafer W is conveyed to the alignment unit (ALIM) of the third processing unit group G3. After the wafer W is aligned by the alignment unit (ALIM), the wafer W is conveyed to the adhesion unit (AD) by the main arm mechanism 7. The required time period after the wafer W is conveyed to the alignment unit (ALIM) until it is conveyed to the adhesion unit (AD) is denoted by t1.

The adhesion unit (AD) performs a hydrophobic process for the wafer W (at step S162). The time period for which the hydrophobic process of the adhesion unit (AD) is performed is denoted by t2. Thereafter, the wafer W is conveyed from the adhesion unit (AD) to the cooling unit (COL). The cooling unit (COL) performs a cooling process for the wafer W (at step S163). The required time period for which the cooling process is performed is denoted by t3. There are four cooling units (COL). The cooling process for the wafer W can be performed by any of the cooling units COL1 to COL4. Likewise, when a plurality of processing units are disposed for the same process in the transient state, in any case, the process can be performed by any unit. Thereafter, the wafer W is aligned and conveyed to the resist solution coating unit (COT) of the first processing unit group G1 (or second processing unit group G2). At a predetermined process time t4, the resist coating unit (COT) rotationally coats the resist to the wafer W (at step S164).

The resist-coated wafer W is inserted into the pre-baking unit (PREBAKE) so as to evaporate solvent (thinner) from the resist solution and dry the wafer W (at step S165). The required time period for which the pre-baking process is performed for the wafer W is denoted by t5.

The wafer W conveyed from the pre-baking unit (PREBAKE) is cooled by the cooling unit (COL) in a predetermined time period t6 (at step S166). Thereafter, the wafer W is transferred to the second sub arm mechanism 9 disposed in the interface portion 4 through the extension unit (EXT).

When the second sub arm mechanism 9 receives a wafer W from the extension unit (EXT), the second sub arm mechanism 9 inserts the wafer W into a buffer cassette BUCR. The interface portion 4 transfers the wafer W to an exposing device 12 (not shown). After the exposing device 12 has performed an exposing process for the wafer W (at step S167), the interface portion 4 receives the wafer W from the exposing device 12. The wafer W is transferred to a peripheral exposing device (WEE). The peripheral exposing device (WEE) exposes an unnecessary resist on the periphery of the wafer W. The resultant wafer W is transferred to the main arm mechanism 7 in the reverse operation. The main arm mechanism 7 inserts the exposed wafer W into a post exposure baking unit (PEBAKE). The required time period after the wafer W is conveyed from the cooling unit (COL) until the exposed wafer W is conveyed to the post exposure baking unit (PEBAKE) is denoted by t7.

The post exposure baking unit (PEBAKE) performs a heating process for the wafer W in a predetermined time period t8 (at step S168). Thereafter, the wafer W is conveyed to the cooling unit (COL). Thereafter, the cooling unit (COL) performs a cooling process for the wafer W at a predetermined temperature in a predetermined time period t9 (at step S169).

The wafer W that has been cooled is inserted into a resist developing device (DEV) of the first processing unit group G1 (or second processing unit group G2). The resist developing device (DEV) develops the wafer W in a predetermined time period t10 (at step S170). The developed wafer W is conveyed to the post baking unit (POBAKE). The post baking unit (POBAKE) performs a heating and drying process for the wafer W in a time period t11 (at step S171). The main arm mechanism 7 conveys the wafer W to the cooling unit (COL4). The cooling unit (COL4) performs a cooling process for the wafer W in a predetermined time period t12 (at step S172). Thereafter, the main arm mechanism 7 conveys the wafer W to the loading/unloading portion 2 through the extension unit (EXT) of the third processing unit group G3 and then inserts the wafer W into the cassette CR (at step S173).

In such a transient state, when wafers W are successively extracted from a cassette CR and then processed, a wafer W that has been extracted from the cassette CR may be processed by another processing unit. The process for the next wafer W may be affected by the process of the first wafer W. When the process for the next wafer W is affected by the process for the first wafer W, the substrate processing system 1 controls processes at intervals of a predetermined number of cycles. In reality, each processing unit has a sensor (not shown) that determines whether or not the unit is performing a predetermined process. Each sensor is connected to the controller 59. Corresponding to the detection signals of the sensors, the controller 59 determines whether or not the process of a wafer W is affected by the process for another wafer W. When the process for a wafer W is affected by the process for another wafer W, the processes for substrates W in the transient state are completed. As a result, the processes for substrates W in the regular state are started.

In the regular state, a plurality of wafers W are supplied to the processing portion 3. In addition, the processes of adjacent units are affected by each other. In the regular state, the process for each unit is performed in a predetermined time period T as one cycle. When the regular state takes place, the state continues until the processes for the last lot are completed.

When the second process completion prediction time for the first lot elapsed after the processes for the first lot were started, the processes for the second lot are performed corresponding to a flow shown in FIG. 15. For the second lot, as shown in FIG. 13B, processes are performed in process conditions different from those for the first lot. When the cycle time period T1 for the first lot is longer than the cycle time period T2 for the second lot (where T1>T2), the time period after the processes for the first lot are started until the third process completion prediction time elapses is processed as one cycle T1. After the third process completion prediction time elapsed, one cycle becomes T2. In contrast, in the case of T1<T2, for the first lot, the processes are performed one cycle time period T2 after the second process completion prediction time elapses. Thereafter, a heat processing unit that has been selected in the above-described manner performs a heat process.

According to the first embodiment, the case that the processor 59a calculates all the first to third process completion prediction times was described. However, it is not necessary to calculate all of them. Alternatively, when at least one type of the process completion prediction times is calculated, the process completion prediction time and the process start prediction time can be calculated.

Thus, according to the first embodiment, corresponding to a recipe that has been set, the process start prediction time at which each heat processing unit for each lot is started and the process completion prediction time at which the process of each heat processing unit for each lot is completed are calculated. Corresponding to the process start prediction time and the process completion prediction time, an optimum processing unit that optimizes the process for each lot is selected. Thus, the amount of power supplied to the heat processing units that accomplish temperatures corresponding to the recipe can be reduced. Consequently, the power consumption can be reduced. In addition, the process cycle time period in the system regular state can be shortened.

In addition, there may be unused heat processing units for each lot. From the unused heat processing units, an optimum processing unit is selected. Thus, even if processing units that have been used in a particular lot do not accomplish a designated temperature for the next lot, an optimum processing unit that satisfies the set temperature can be selected.

(Second Embodiment)

Next, a modification of the first embodiment will be described as a second embodiment of the present invention. According to the second embodiment, when the operator could not change a cassette CR in a time period for which the cassette CR can be changed, the successive lot processes are suspended. According to the second embodiment, in such a case, the heat process start time for each heat processing unit is compensated.

As was described in the first embodiment, the heat process start time has been obtained when the successive lot processes are performed (namely, when real processes for the first lot are performed). However, when the operator could not mistakenly change a cassette CR in the time period for which the cassette CR can be changed, the heat process start time deviates from the real process start time for the first lot. In other words, since a cassette CR has not been changed, the continuous processes for the next lot are not started. However, a heat processing unit starts performing the heat process.

To solve such a problem, according to the second embodiment of the present invention, the controller 59 cumulates time lags corresponding to sensor outputs after the sensors (not shown) detect that cassettes CR for individual lots that are successively processed have not been changed. Thereafter, the controller 59 adds the cumulated time lags to the cassette changeable time periods that have been calculated in the successive lot processes.

Next, with reference to timing charts shown in FIGS. 17 and 18, a more real cassette changing operation in the successive lot processes will be described.

Figure 17:
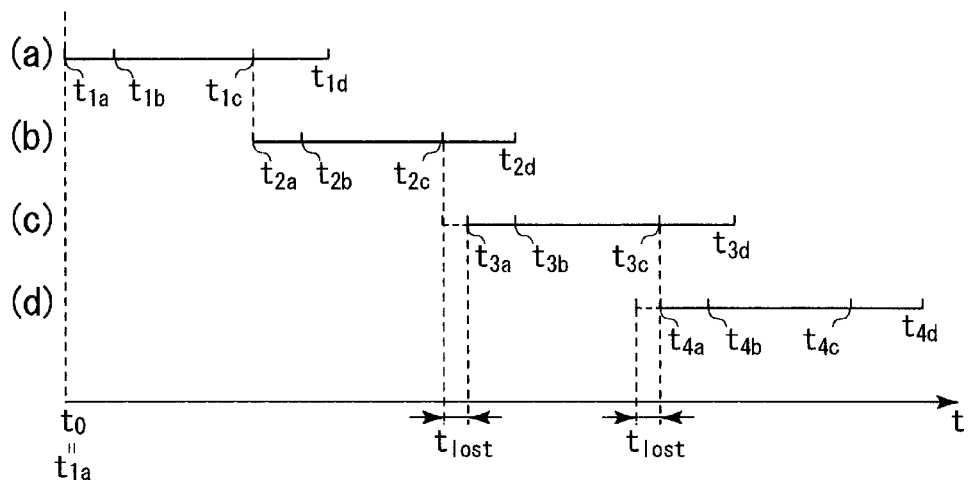
FIG. 17 is a timing chart showing real processes for individual lots of a substrate processing system according to a second embodiment of the present invention.
Figure 18:
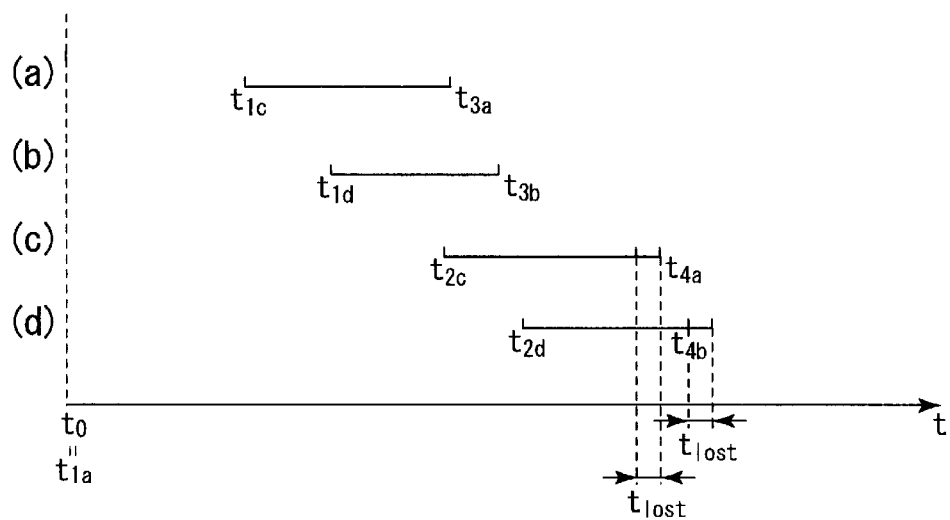
FIG. 18 is a timing chart showing cassette changeable time periods of individual stages in the timings shown in FIG. 16.

FIG. 17 is a timing chart showing real processes for first to fourth lots. In FIGS. 17, (a) to (d) show required time periods for the first to fourth lots (t1a to t1d, t2a to t2d, t3a to t3d, and t4a to t4d), respectively. FIG. 18 is a timing chart showing cassette changeable time periods corresponding to the timing chart shown in FIG. 17. The cassette changeable time period represents a time period for which a cassette can be hanged for the next lot in the successive lot processes. When a cassette is changed after the cassette changeable time has elapsed, the successive lot processes are stopped.

Now, it is assumed that the first lot has been processed before the third lot is processed. In addition, it is assumed that after the cassette changeable time period for a unprocessed substrate cassette (start cassette) CR has elapsed by a time t-lost without changing the cassette CR, it is changed. In such a case, the real processes for the third lot are started with a delay of t-lost. At the heat process start time according to the first embodiment, the power is supplied to the heater 65a of each heat processing unit in a timing without consideration of t-lost. In contrast, according to the second embodiment, the controller 59 cumulates the time lag t-lost corresponding to an output of a sensor (not shown). Thus, until the time lag t-lost elapses, the power is not supplied to the heater 65a of each heat processing unit.

After the time t-lost has elapsed, the heat process start time advances again. Thus, as shown in (c) and (d) of FIG. 18, the cassette changeable time periods are displayed with a delay of the time lag t-lost against the calculated values. In addition, the power is supplied to the heater 65a with a delay of t-lost. Since the heat process start time is delayed by a time period for which the cassette changeable time period has elapsed, the power can be accurately supplied to the heater 65a in a proper timing regardless of whether or not the operator forgot to change a cassette.

Figure 19:
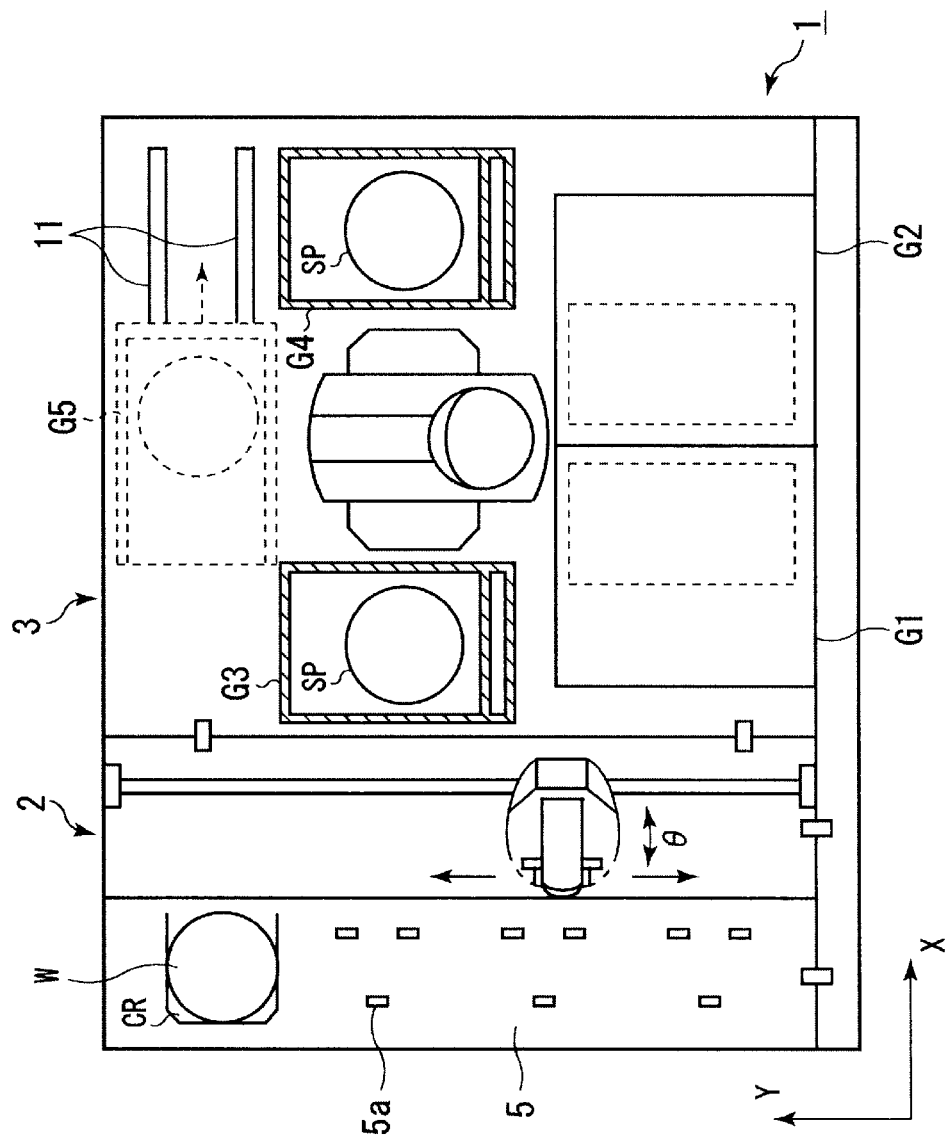
FIG. 19 is a plan view showing the overall structure of a substrate processing system according to a modification of the present invention.

It should be noted that the present invention is not limited to the above-mentioned embodiments. In other words, the present invention can be applied to units other than the above-described substrate processing units. For example, the units of each processing unit group may be used for other processes. In addition, the number of units of each processing unit group can be changed. Moreover, according to the above-described embodiments, the present invention can be applied to a substrate processing system for a photolithography process. However, the present invention can be also applied to a processing system shown in FIG. 19. The processing system shown in FIG. 19 is composed of a loading/unloading portion 2 and a processing portion 3 without an interface portion 4 and an exposing device 12.

Figure 14:
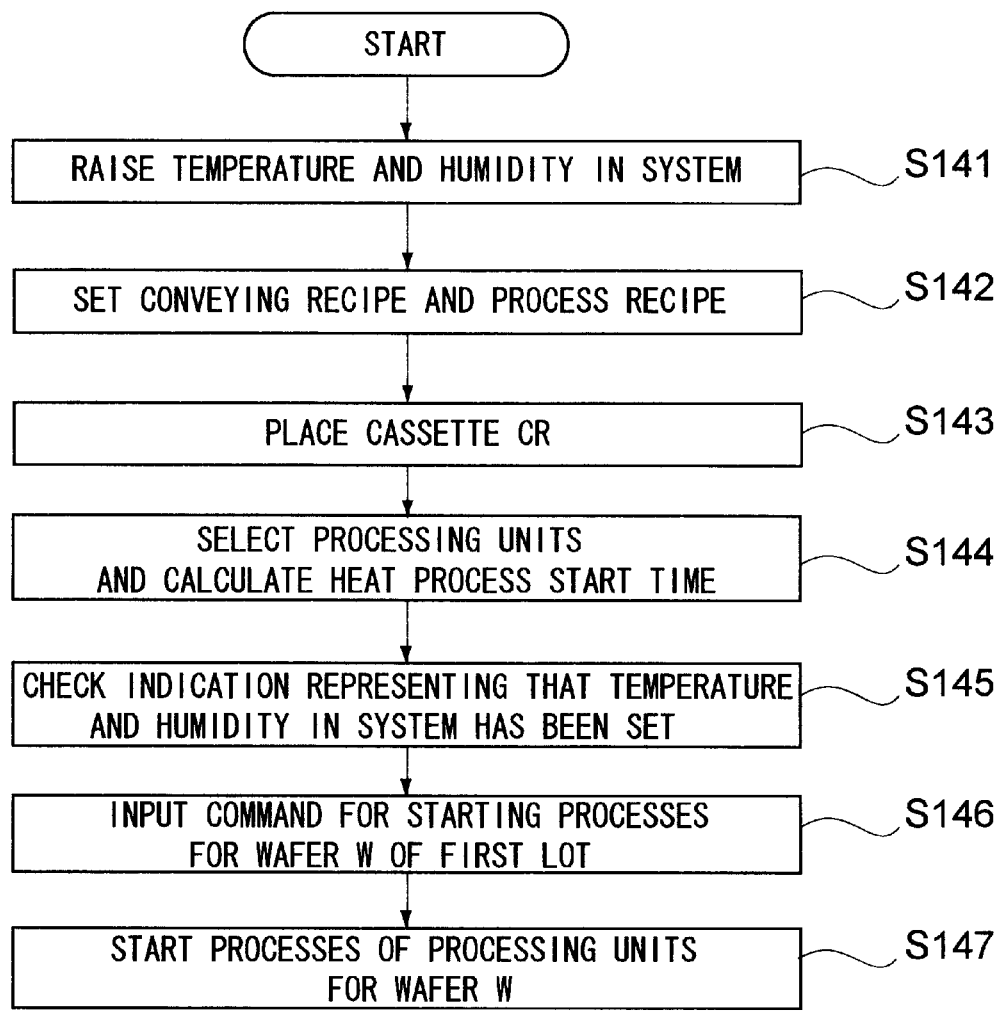
FIG. 14 is a flow chart for explaining processes of the substrate processing system according to the first embodiment of the present invention.

In addition, at step S145 shown in FIG. 14, the operator checks that the temperature and temperature have been set in the system (at step S146) and inputs a start command for the real processes for wafers. However, it should be noted that the present invention is not limited to such a structure. Alternatively, when the controller 59 determines that the temperature and humidity have been set in the substrate processing system 1, the controller 59 may automatically start the real processes for wafers W without need to wait for an input of an operator's command.

A recipe that operator sets for each lot does not always contains all process conditions. For example, a recipe for each lot may be addressed and stored to the memory 59b. In the case, when the operator inputs a desired address, a recipe corresponding thereto is automatically set.

In addition, according to the above-described embodiments, the heater 65a that heats the hot plate 65 is composed of a thermocouple. However, it should be noted that the present invention is not limited to such a structure. Alternatively, the hot plate 65 may be a jacket having a hollow portion in which a heat medium is circulated so as to heat a wafer W. Further alternatively, a heat pipe may be disposed in the hollow portion so as to heat the hot plate 65. When the heat medium or the heat pipe is used, it is preferred to use heating and cooling characteristic curves instead of those shown in FIGS. 10A and 10B.

According to the above-described embodiments, the process start prediction time and the process completion prediction time are calculated corresponding to the first to third process completion prediction times. However, it should be noted that the present invention is not limited to such a structure. For example, the process start prediction time and the process completion prediction time may be calculated corresponding to those of particular recipes that have been set in the past.

According to the above-described embodiments, units for the first lot are selected corresponding to data that is input by the operator. However, it should be noted that the present invention is not limited to such a structure. For example, the processor 59a may automatically select units corresponding to really measured temperatures of heat processing units that have not performed the processes for one lot and set temperatures.

In addition, according to the above-described embodiments, heat processing units (BAKE) are automatically selected. However, it should be noted that the present invention is not limited to such a structure. For example, cooling units (COL) having different process conditions may be automatically selected. Alternatively, resist coating units (COT) having different process conditions may be automatically selected. For example, according to the above-described embodiments, as shown in FIGS. 1 to 3, in the case that there are two resist coating units (COT), when the system 1 is started, the temperature and humidity in the resist coating unit (COT) are adjusted. Alternatively, for example, a resist coating unit (COT) that accomplishes designated temperature and humidity may be automatically selected. Further alternatively, a resist coating unit (COT) of which the temperature of resist discharged from a resist discharging nozzle (not shown) disposed in the resist coating unit (COT) accomplishes a desired temperature characteristic in the shortest time may be selected.

As was described above, according to the present invention, an optimum processing unit can be automatically selected corresponding to the process completion prediction time for each process for a particular lot, the set temperature for the next lot, and the process start prediction time for the next lot.

The disclosure of Japanese Patent Application No.2000-170583 filed Jun. 7, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing system, comprising:
   a processing portion having a plurality of processing units for performing a plurality of processes for a first substrate and a second substrate;
   a conveying portion, disposed in said processing portion, for exchanging the first substrate and the second substrate at least between the processing units;
   a process procedure setting portion for setting a process procedure that includes process conditions corresponding to the first substrate and the second substrate; and
   a selecting portion for obtaining a process start prediction time at which the process of each of the processing unit is started for the first substrate and the second substrate and a process completion prediction time at which the process of each of the processing units is completed for the first substrate and the second substrate corresponding to said processing procedure and for selecting at least one of optimum processing units that optimize the processes for each of the first substrate and the second substrate in each of said first substrate and said second substrate corresponding to the process start prediction time and the process completion prediction time, the process start prediction time and the process completion prediction time being obtained for at least two processes.

2. A substrate processing system, comprising:
   a loading/unloading portion for loading a cassette that contains a plurality of unprocessed substrates for one lot and for unloading a cassette that contains a plurality of processed substrates for one lot;
   a processing portion having a plurality of processing units for performing a plurality of processes for a substrate;
   a conveying portion, disposed in said processing portion, exchanging substrates with said loading/unloading portion and successively conveying the substrates to the processing units;

a process procedure setting portion for setting a process procedure that includes at least process conditions for each of lots; and a calculation processing portion for calculating a process start prediction time at which the process of each processing unit is started for each of lots and a process completion prediction time at which the process of each processing unit is completed for each of lots and for selecting at least one of optimum processing units that optimize processes for each of lots corresponding to the process start prediction time and the process completion prediction time, the process start prediction time and the process completion prediction time being obtained for at least two processes.

3. The system as set forth in claim 2,
wherein said process procedure setting portion sets a plurality of processes among a plurality of said processes that are shareable with a predetermined processing unit, and
wherein said calculation processing portion leaves at least one of processing units that are sharable with each of lots unused and selects at least one optimum processing unit from a plurality of said unused processing units for a first lot when any processing unit used for the first lot is unable to accomplish a process procedure for the next lot.

4. The system as set forth in claim 2,
wherein said calculation processing portion successively selects optimum processing units that accomplish the process procedure in shorter time periods after the process completion prediction time for one lot until the process start prediction time for the next lot.

5. The system as set forth in claim 2,
wherein said calculation processing portion calculates a control start time at which a processing unit starts a process procedure for a second lot after a process for a first lot is completed until a process for the second lot is completed.

6. The system as set forth in claim 2,
wherein the processing units include at least two heat processing units, and
wherein the process procedure contains a set temperature for each of the heat processing units for each lot.

7. The system as set forth in claim 6,
wherein said calculation processing portion selects an optimum processing unit from a plurality of heat processing units corresponding to the set temperature.

8. The system as set forth in claim 6,
wherein said calculation processing portion has:
a storing portion for storing a heating characteristic curve and a cooling characteristic curve for the heat processing units, and
wherein said calculation processing portion selects an optimum processing unit corresponding to the heating characteristic curve and the cooling characteristic curve stored in the storing portion.

9. The system as set forth in claim 8,
wherein said calculation processing portion calculates a start time at which each of the heat processing units starts controlling a temperature corresponding to the process completion prediction time, the process start prediction time, the heating characteristic curve, and the cooling characteristic curve.

10. The system as set forth in claim 2,
wherein said calculation processing portion has:
a storing portion, and
wherein said calculation processing portion calculates the process start prediction time and the process completion prediction time corresponding to past process procedures and completion times stored in the storing portion.

11. The system as set forth in claim 2,
wherein said calculation processing portion calculates the process start prediction time and the process completion prediction time corresponding to a process completion prediction time for predicting a timing for processes for one lot and to a process cycle time period of each of the processing units.

12. The system as set forth in claim 11,
wherein the process completion prediction time is a first process completion prediction time after the first substrate of one lot is conveyed to a processing unit until the first substrate is returned to said loading/unloading portion.

13. The system as set forth in claim 11,
wherein the process completion prediction time is a second process completion prediction time after the first substrate of one lot is conveyed to a processing unit until all substrates of the same lot are conveyed to the processing unit.

14. The system as set forth in claim 11,
wherein the process completion prediction time is a third process completion prediction time after the first substrate of one lot is conveyed to a processing unit until all substrates of the same lot are returned from the processing unit to said loading/unloading portion.

15. The system as set forth in claim 2,
wherein said calculation processing portion has:
a storing portion for storing an elapsed time after the cassette changeable time period until a cassette change completion time.

16. A substrate processing method for successively extracting unprocessed substrates, successively conveying the extracted substrates to a plurality of processing units, causing the processing units to process the conveyed substrates, and successively returning the processed substrates to a cassette, the method comprising the steps of:
calculating a process start prediction time at which the processes for each lot are started and a process completion prediction time at which the processes for each lot are completed for each lot corresponding to a process procedure that includes process conditions for each of at least one lot, the process start prediction time and the process completion prediction time being calculated for at least two processes; and
selecting at least one of optimum processing units for each lot for optimizing processes in said each lot corresponding to the process start prediction time and the process completion prediction time.

* * * * *